United States Patent
Pal et al.

(10) Patent No.: US 12,316,368 B2
(45) Date of Patent: *May 27, 2025

(54) HYBRID COUPLER BASED T/R SWITCH

(71) Applicant: Murata Manufacturing Co., Ltd., Kyoto (JP)

(72) Inventors: Kashish Pal, Reading (GB); Vikas Sharma, Reading (GB); Sebastian Diebold, Reading (GB); Leland Gilreath, San Diego, CA (US); Daoud Salameh, Reading (GB); Farshid Aryanfar, San Diego, CA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 1126 days.

This patent is subject to a terminal disclaimer.

(21) Appl. No.: 17/141,857

(22) Filed: Jan. 5, 2021

(65) Prior Publication Data
US 2021/0203374 A1   Jul. 1, 2021

Related U.S. Application Data

(63) Continuation-in-part of application No. 17/083,859, filed on Oct. 29, 2020, now abandoned, which is a
(Continued)

(51) Int. Cl.
*H04B 1/44* (2006.01)
*H03F 3/19* (2006.01)

(52) U.S. Cl.
CPC .............. *H04B 1/44* (2013.01); *H03F 3/19* (2013.01); *H03F 2200/294* (2013.01); *H03F 2200/451* (2013.01)

(58) Field of Classification Search
CPC .................................. H04B 1/44; H03F 3/19
See application file for complete search history.

(56) References Cited

U.S. PATENT DOCUMENTS

| | | |
|---|---|---|
| 7,123,898 B2 | 10/2006 | Burgener et al. |
| 7,248,120 B2 | 7/2007 | Burgener et al. |

(Continued)

OTHER PUBLICATIONS

Sharma, Vikas, "Low Loss, Wide Band, Phase Shifter Utilizing Transformer", patent application filed in the USPTO on Dec. 27, 2017, U.S. Appl. No. 15/855,901, 60 pgs.
(Continued)

*Primary Examiner* — Ayodeji O Ayotunde
(74) *Attorney, Agent, or Firm* — Steinfl + Bruno LLP

(57) ABSTRACT

A hybrid coupler-based T/R switch for use in a TDM system. An output hybrid coupler of a balanced amplifier is used to selectively switch a transmit or receive path to an antenna. During transmission, power at the output of the balanced amplifier is delivered directly to the antenna. During reception, power from the antenna is reflected through ports of the hybrid coupler connected to respective two amplifiers of the balanced amplifier, to constructively combine at a port of the coupler coupled to the receive path, with a ninety degrees phase shift. A pair of shunting switches or series switches coupled to the ports of the hybrid coupler connected to the two amplifiers, and a shunting switch coupled to the port coupled to the receive path, control operation of the hybrid coupler-based T/R switch. An additional switch coupled to the port of the coupler that is coupled to the receive path can provide a bypass path for reception or transmission through the antenna while bypassing the balanced amplifier of the transmit path and an amplifier of the receive path.

30 Claims, 25 Drawing Sheets

Related U.S. Application Data continuation-in-part of application No. 15/971,992, filed on May 4, 2018, now Pat. No. 10,848,197.

(56) References Cited

U.S. PATENT DOCUMENTS

| | | | |
|---|---|---|---|
| 7,890,891 B2 | 2/2011 | Stuber et al. | |
| 8,742,502 B2 | 6/2014 | Brindle et al. | |
| 9,602,091 B1 | 3/2017 | Sharma | |
| 9,722,551 B1 | 8/2017 | McKinley | |
| 10,848,197 B2 * | 11/2020 | Pal | H04B 1/44 |
| 2003/0193369 A1 * | 10/2003 | Jackson | H03F 3/60 |
| | | | 330/51 |
| 2009/0015323 A1 | 1/2009 | Wyse | |
| 2009/0278624 A1 | 11/2009 | Tsai | |
| 2010/0026388 A1 | 2/2010 | Plotka | |
| 2017/0194688 A1 | 7/2017 | Sharma et al. | |
| 2017/0288607 A1 | 10/2017 | Alijabbari | |
| 2018/0019722 A1 | 1/2018 | Birkbeck | |
| 2019/0198957 A1 | 6/2019 | Sharma | |
| 2019/0341960 A1 | 11/2019 | Pal et al. | |

OTHER PUBLICATIONS

Huang, Weibin, Office Action received from the USPTO dated Dec. 16, 2019 for U.S. Appl. No. 15/971,992, 7 pgs.

Huang, Weibin, Office Action received from the USPTO dated Apr. 17, 2020 for U.S. Appl. No. 15/971,992, 12 pgs.

Huang, Weibin, Notice of Allowance received from the USPTO dated Jul. 21, 2020 for U.S. Appl. No. 15/971,992, 10 pgs.

PSemi Corporation, Response filed in the USPTO dated Dec. 27, 2019 for U.S. Appl. No. 15/971,992, 8 pgs.

PSemi Corporation, Response filed in the USPTO dated Apr. 24, 2020 for U.S. Appl. No. 15/971,992, 8 pgs.

PSemi Corporation, Supplemental Amendment filed in the USPTO dated Jul. 10, 2020 for U.S. Appl. No. 15/971,992, 8 pgs.

PSemi Corporation, Amendment After Allowance filed in the USPTO dated Sep. 4, 2020 for U.S. Appl. No. 15/971,992, 8 pgs.

* cited by examiner

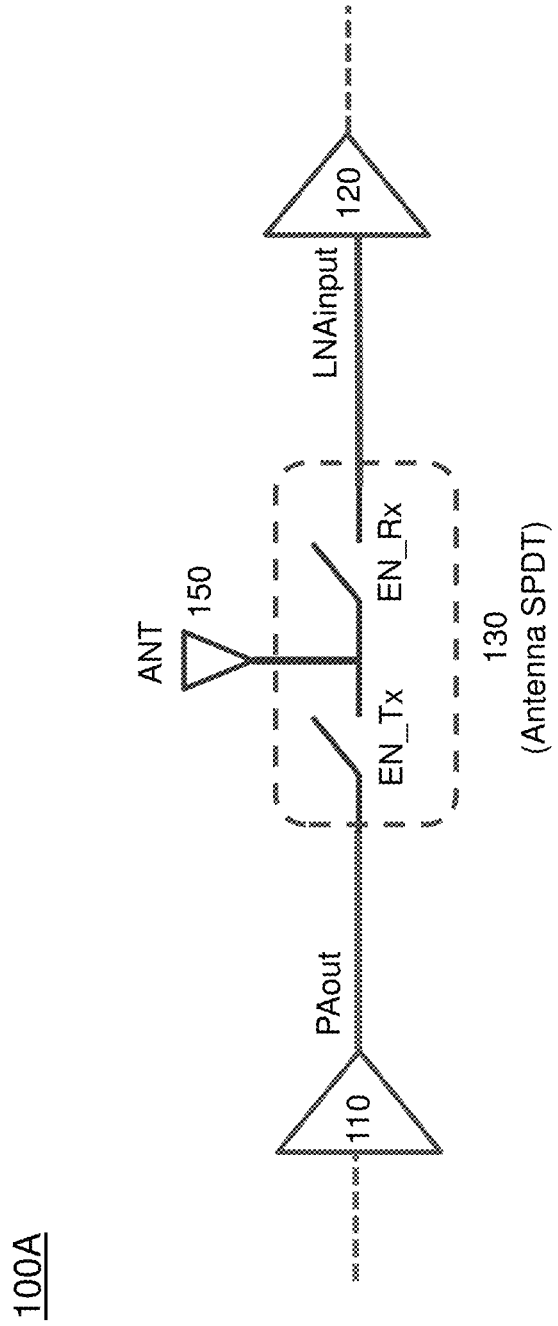
FIG. 1A  *Prior Art*

FIG. 3 *Prior Art*

Tx Mode: PA ON
LNA OFF

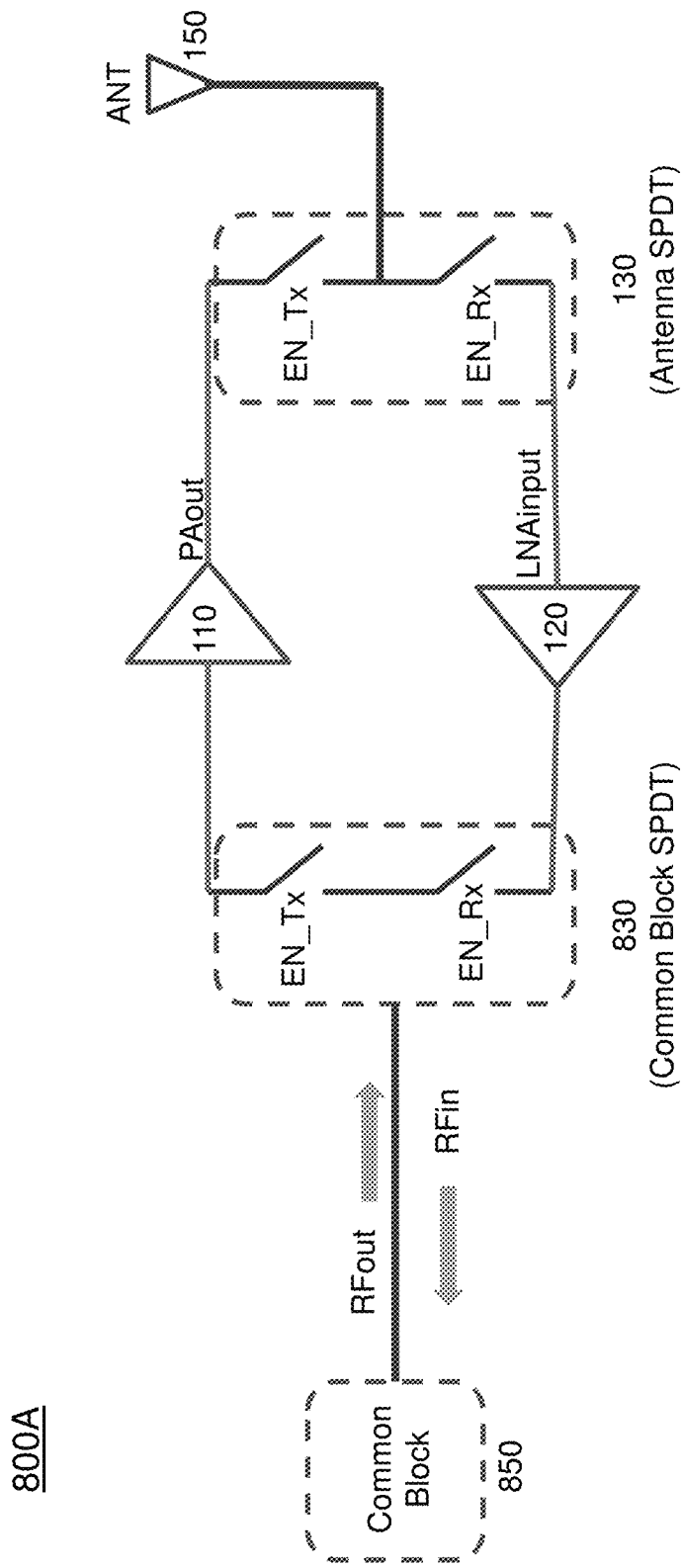
FIG. 8A  *Prior Art*

HYBRID COUPLER BASED T/R SWITCH

CROSS REFERENCE TO RELATED APPLICATIONS

The present application is a continuation in part of U.S. application Ser. No. 17/083,859 filed on Oct. 29, 2020, entitled "Hybrid Coupler Based T/R Switch" which in turn is a continuation in part of U.S. application Ser. No. 15/971,992 filed on May 4, 2018, entitled "Hybrid Coupler Based T/R Switch", now U.S. Pat. No. 10,848,197 issued Nov. 24, 2020, the disclosures of which are incorporated herein by reference in their entirety.

The present application may be related U.S. Patent Publication No. 2017/0194688 A1, entitled "Reflection-Based RF Phase Shifter", published on Jul. 6, 2017, the disclosure of which is incorporated herein by reference in its entirety. The present application may also be related U.S. patent application Ser. No. 15/855,901, entitled "Low Loss, Wide Band, Phase Shifter Utilizing Transformer", filed on Dec. 27, 2017, the disclosure of which is incorporated herein by reference in its entirety.

TECHNICAL FIELD

The present teachings relate to radio frequency (RF) circuits. More particularly, the present teachings relate to methods and apparatuses for receive and transmit RF signal switching in a time-division multiplexed system.

BACKGROUND

In the time-division multiplexed (TDM) system 100A shown in FIG. 1A, one or more switches (EN_Tx, EN_Rx, configured, for example, as a SPDT switch) may be used to connect and disconnect an RF transmit path (110, . . . ) and an RF receive path (120, . . . ) to a common antenna (150) for respectively sending and receiving an RF signal via the common antenna (150). Such switches, generally known in the art as T/R switch (transmit/receive switch, 130), are designed to minimize signal loss between the common antenna (150) and the transmit/receive paths (110, . . . / 120, . . . ), and to reduce any leakage from the high power RF transmit path (110, . . . ) into the low power and sensitive RF receive path (120, . . . ). The RF transmit path (110, . . . ) may include an RF amplifier (e.g., power amplifier, PA, 110) that amplifies an RF signal to be transmitted, at high power, through the antenna (150). Likewise, the RF receive path (120, . . . ) may include an amplifier (e.g., low noise amplifier, LNA, 120) that amplifies a low power RF signal received from the antenna (150) for further downstream processing. As shown in FIG. 1B and FIG. 1C, during a transmission phase and a reception phase of the TDM system of FIG. 1A, the T/R switch (130) respectively selectively connects the output of the transmit path (110, . . . ) and the input of the receive path (120, . . . ) to the common antenna (150) while disconnecting the other one of the transmit path and the receive path from the antenna. It should be noted that in some implementations, elements of the transmit path, such as for, example, the PA (110), can be deactivated during a receive phase of the TDM system (100A of FIG. 1A, 100C of FIG. 1C later described), and elements of the receive path, such as for, example, the LNA (120), can be deactivated during a transmit phase of the TDM system (100A of FIG. 1A, 100B of FIG. 1B later described). As it is well known to a person skilled in the art, activation and deactivation of such elements in view of a phase of operation of the system (100A) may be performed synchronous with control of the T/R switch (130), as performed, for example, by a signal aware controller such as a transceiver (not shown in FIG. 1A).

In some cases, the PA (110) and/or LNA (120) used in the transmit and receive paths of the TDM system may be balanced amplifiers that operate on phase-shifted signals, such as, for example, the ninety-degrees balanced amplifier (200) shown in FIG. 2. As it is well known to a person skilled in the art and shown in FIG. 2, the balanced amplifier (200) includes two amplifying devices (110a, 110b) that may operate in quadrature. That is, they operate 90 degrees apart, or in other words, they process/amplify RF signals of same power but in quadrature phase. A hybrid coupler (3501), also known as a quadrature coupler, provided at an input of the balanced amplifier (200), splits an input RF signal provided at an input node PAin of the amplifier, to two quadrature signals (i.e., 90 degrees apart) of substantially same power (e.g., amplitude) that are respectively fed to the two amplifying devices (110a, 110b). A second hybrid coupler (3502) at the outputs of the two amplifying devices (110a, 110b) constructively combines the two phase-shifted (quadrature) signals at respective output nodes, PAout_a and PAout_b, of the amplifying devices to generate a combined output RF signal at an output node PAout of the balanced amplifier (300) with a power that is substantially equal to the power of the input RF signal at input node PAin multiplied by the by the gain of the PA.

It should be noted that detailed description of such prior art discussed above is outside the scope of the present disclosure, as a person skilled in the art is well aware of it. For example, a person skilled in the art will recognize the hybrid coupler (350) shown in FIG. 3, having four ports: Coupled Port (CP), Direct Port (DP), Input Port (IP), and Isolated Port (ISO), with paths between two ports providing either zero degrees, 0°, phase delay or a ninety degrees, 90°, phase delay as shown in FIG. 3. For example, the hybrid coupler (350) can be used as a reflective phase shifter, where an input signal provided at the Input Port (IP) is split into two signals of equal power but ninety degrees, 90°, out of phase that are provided at the Coupled Port (CP) and the Direct Port (DP). In turn, the signals at ports CP and DP can reflect and combine in phase (constructively) at the Isolated Port (ISO) so long as the impedances at ports CP and DP are identical. Some description of usage of such hybrid coupler can be found, for example, in the above referenced U.S. Patent Publication No. 2017/0194688 A1 and U.S. patent application Ser. No. 15/855,901, the disclosures of which are incorporated herein by reference in their entirety.

A person skilled in the art knows the performance advantages of using balanced amplifiers in the transmit and/or receive paths of a TDM system, such as the system (400) shown in FIG. 4, including higher power handling, and higher immunity with respect to VSWR (voltage standing wave ratio) performance due to, for example, reduced losses to reflections arising from mismatched amplifiers. However, and with reference to FIG. 4, which shows coupling of the output stage hybrid coupler (3502) of the balanced amplifier (200) and of the LNA amplifier (120), to the T/R switch (130) of the prior art TDM system (400), such T/R switch (130) can introduce added mismatch as well as power dissipation through the T/R switch (130), and therefore negatively affect performance of the TDM system (400). For example, with further reference to FIG. 4, during a transmission phase of the TDM system (400), the EN_Tx switch of the T/R switch (130) is closed, and therefore the RFout signal output at node PAout of the balanced amplifier (200)

can be attenuated due to an ON resistance of the EN_Tx switch. Likewise, during a reception phase of the TDM system (400), the EN_Tx switch of the T/R switch (130) is open, and therefore a corresponding OFF capacitance can introduce a mismatch condition between the antenna (150) and the input of the LNA amplifier (120) of the receive path.

It follows that there is a need to address negative effects on system performance due to the T/R switch used in a TDM system. This is a motivation for the teachings according to the present disclosure.

SUMMARY

According to a first aspect of the present disclosure, a circuit arrangement is presented, the circuit arrangement comprising: i) a balanced amplifier comprising an output hybrid coupler comprising a first port, coupled port (CPL), a second port, direct port (DIR), a third port, isolated port (ISO), and a fourth port, input port (IN), the fourth port, IN, being configured for connection to an antenna; ii) first and second switches of a first set of switches, respectively coupled to the first port, CPL, and the second port, DIR; iii) a third switch of the first set of switches coupled to the third port, ISO, the third switch configured to selectively couple a terminating resistor to the third port, ISO; and iv) a fourth switch of the first set of switches coupled to the third port, ISO, the fourth switch configured to selectively couple a bypass conduction path to the third port, ISO, wherein during a first mode of operation of the circuit arrangement: the first and second switches are configured to respectively couple amplified phase-shifted signals of the balanced amplifier to the first port, CPL, and the second port, DIR, the third switch is closed so to couple the terminating impedance to the third port, ISO, and the fourth switch is open so to decouple the bypass conduction path from the third port, ISO.

According to second aspect of the present disclosure, a circuit arrangement is presented, the circuit arrangement comprising: a balanced amplifier comprising an input hybrid coupler; and a first set of switches, comprising first, second, and third switches, respectively coupled to ports: coupled port (CPL); direct port (DIR); and input port (IN), of the input hybrid coupler, wherein open and closed states of the switches of the first set of switches are configured to control operation of the input hybrid coupler as a hybrid coupler-based switch comprising a first state and a second state, wherein in the first state, a signal at a port, isolated port (ISO), of the input hybrid coupler is divided at the ports CPL and DIR of the input hybrid coupler to generate input quadrature signals for amplification by the balanced amplifier, and wherein in the second state, a signal at the port IN of the input hybrid coupler is divided at, and reflected from, the ports CPL and DIR of the input hybrid coupler, to combine at the port ISO of the input hybrid coupler.

According to a third aspect of the present disclosure, a circuit arrangement is presented, the circuit arrangement comprising: a balanced amplifier comprising an output hybrid coupler; and a first set of switches, comprising first, second, and third switches, respectively coupled to ports: coupled port (CPL); direct port (DIR); and isolated port (ISO), of the output hybrid coupler, wherein open and closed states of the switches of the first set of switches are configured to control operation of the output hybrid coupler as a hybrid coupler-based switch comprising a first state and a second state, wherein in the first state, amplified quadrature signals of the balanced amplifier at the ports CPL and DIR of the output hybrid coupler are combined at the port IN of the output hybrid coupler, and wherein in the second state, a signal at the port IN of the output hybrid coupler is divided at, and reflected from, the ports CPL and DIR of the output hybrid coupler, to combine at the port ISO of the output hybrid coupler, or a signal at the port ISO of the output hybrid coupler is divided at, and reflected from, the ports CPL and DIR of the output hybrid coupler, to combine at the port IN of the output hybrid coupler.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1A shows a block diagram of a prior art transmit/receive (T/R) switch of a time-division multiplexed (TDM) system.

FIG. 8A shows a block diagram of a prior art TDM system wherein a common signal processing block for processing receive and transmit signals is accessed via a T/R switch.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios) having a plurality of devices, such as for example, transistors (e.g., MOSFETs). Persons skilled in the art will appreciate that such electrical circuits comprising transistors can be arranged as amplifiers.

As used herein, the expression "operating frequency" can refer to a frequency of a signal being input to a device (such as an amplifier).

Apparatus and methods that provide switching function between a common antenna and, receive and transmit paths of a TDM system, by way of a hybrid coupler coupled at an output stage of an amplifier of the transmit path of the TDM system are presented. Accordingly, transmission and reception of an RF signal to and from a common antenna of the TDM system can be performed free of a series-connected T/R switch, and therefore with an overall lower signal loss when compared to the prior art TDM system using a T/R switch. Furthermore, other advantages inherent to using of a balanced amplifier configuration can be maintained while removing the negative effects of the T/R switch, resulting in a lower insertion loss, a more compact physical layout, and a wide frequency range of operation (e.g. DC up to 1 GHz, 10 GHz, 50 GHz and beyond). It should be noted that teachings according to the present disclosure equally apply to any system or method for receiving and transmitting signals according to a time division scheme from and to a common antenna, including, for example, time-division duplex (TDD) systems. Furthermore, if desired, the switching function can be further used to select a bypass path for direct coupling of an RF signal to, or from, the common antenna while bypassing a transmit side or a receive side amplifier.

Figure 5A:
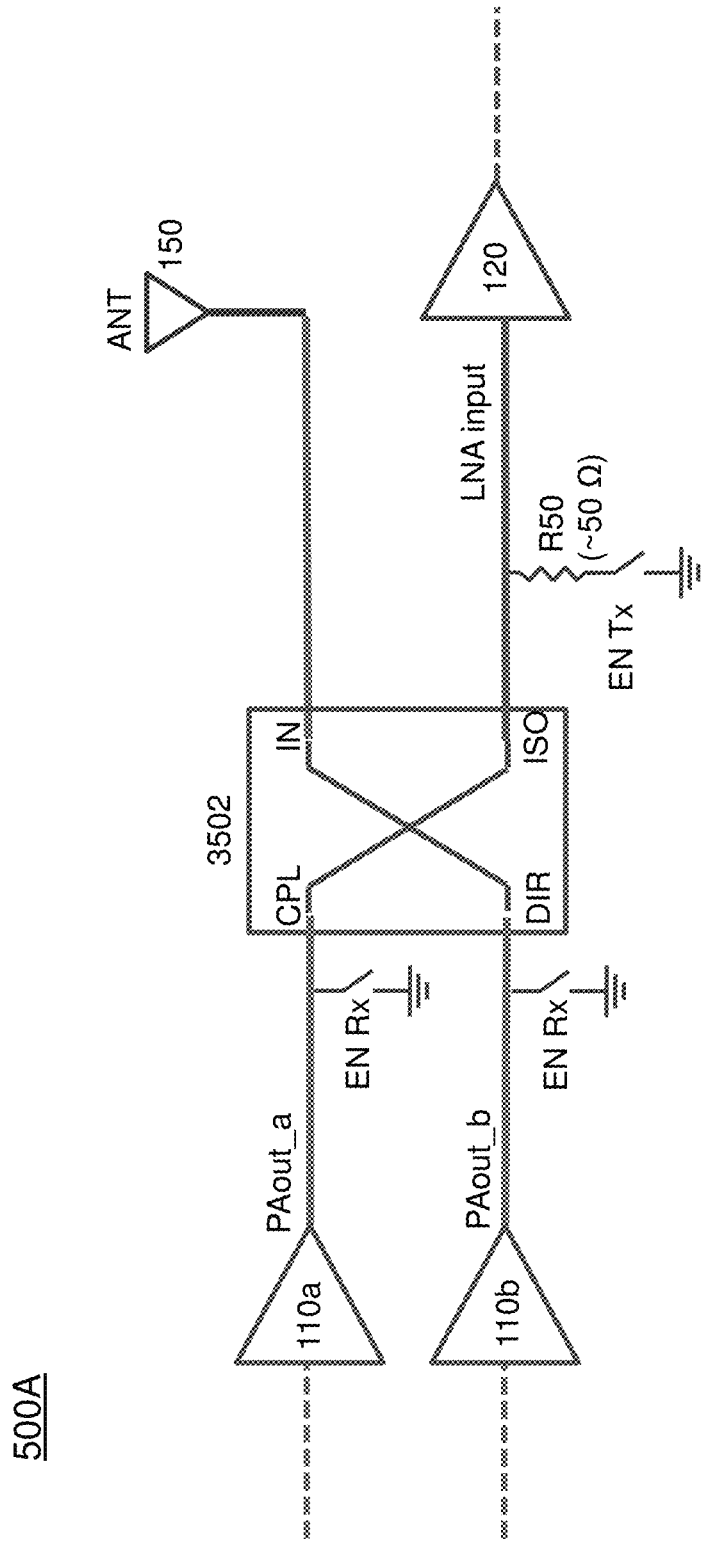
FIG. 5A shows a block diagram of a TDM system according to an embodiment of the present disclosure comprising a balanced amplifier whose output stage hybrid coupler performs the task of a T/R switch.

FIG. 5A shows a block diagram of a TDM system (500A) according to an embodiment of the present disclosure comprising a balanced amplifier (200) whose output stage hybrid coupler (3502) performs the task of the T/R switch (130) discussed above in reference to the prior art. A person skilled in the art clearly understands that the balanced amplifier (200) is part of a transmit path of the TDM system (500A) which may include additional components, active or passive, coupled to the balanced amplifier (200). Operation between transmission phase and reception phase of the TDM system (500) can be controlled/selected by way of a pair of shunting switches, EN_Rx, coupled (i.e., connected) to respective ports CPL and DIR of the hybrid coupler (3502), and a shunting switch (EN_Tx) coupled to the ISO port of the hybrid coupler (3502) via a series-connected resistor R50. As can be seen in FIG. 5A, by way of the architecture of the balanced amplifier (200), the pair of shunting switches, EN_Rx are also connected to a respective output node, PAout_a and PAout_b, of the amplifier devices (110a) and (110b) of the balanced amplifier (200). Furthermore, as can be seen in FIG. 5A, the shunting switch EN_Tx is coupled to the input of the LNA amplifier (120). The IN port of the hybrid coupler (3502) is connected to the antenna (150) of the TDM system (500A). It should be noted that the shunting switches EN_Rx and EN_Tx may be any type of switch known to a person skilled in the art, including and not limited to a FET based switch comprising one or more stacked FETs, as described, for example, in U.S. Pat. No. 7,890,891, issued on Feb. 15, 2011, entitled "Method and Apparatus Improving Gate Oxide Reliability by Controlling Accumulated Charge", the disclosure of which is incorporated herein by reference in its entirety. A person skilled in the art would clearly understand that as used in the present disclosure, and as shown, for example, in FIG. 5A, a "shunting switch" refers to a switch with one terminal connected to a reference ground so that the other terminal of the switch can be selectively shunted to the reference ground when the switch is closed.

Figure 4:
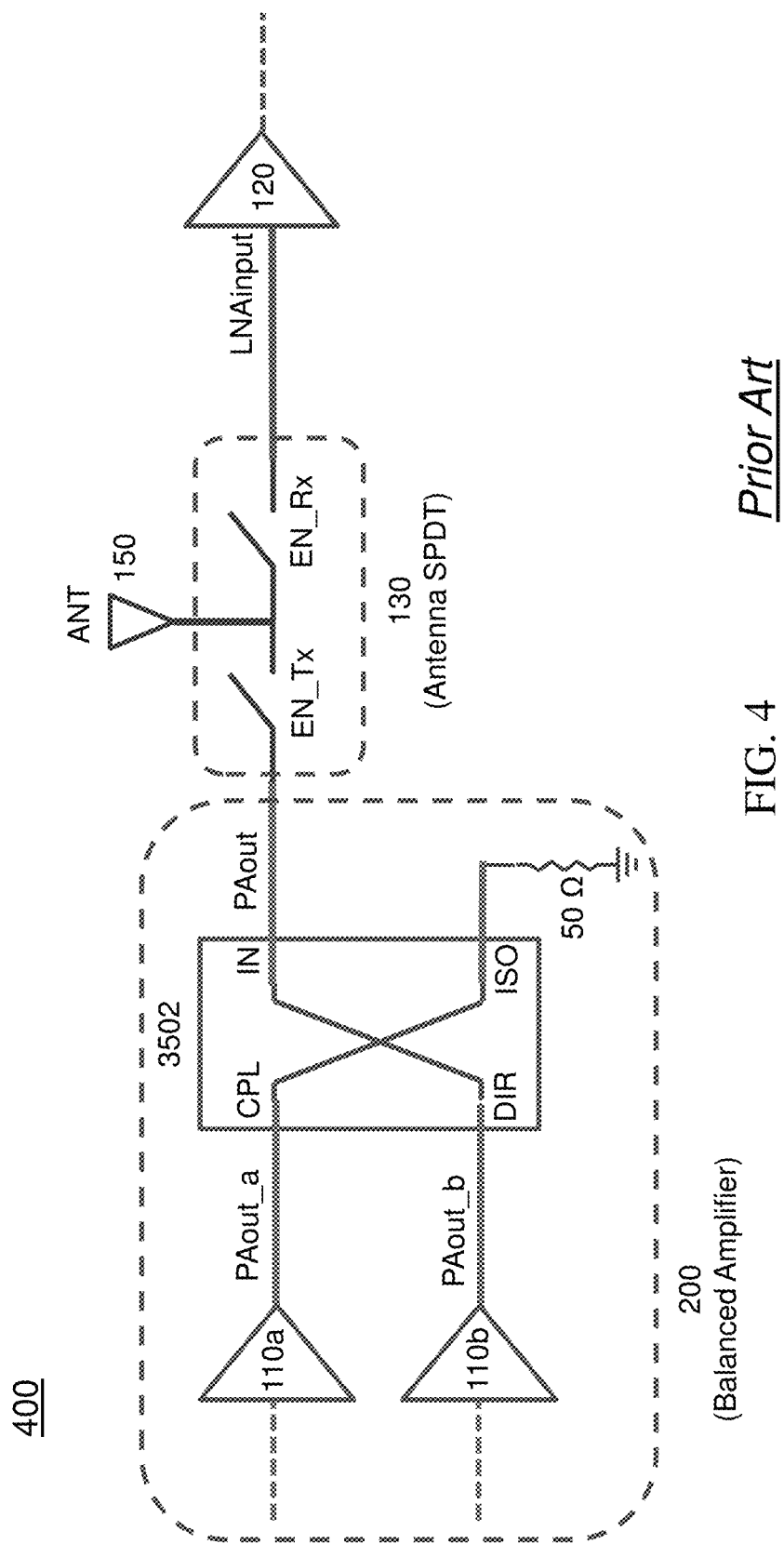
FIG. 4 shows coupling of an output stage hybrid coupler of a balanced amplifier of a transmit path of a TDM system to the T/R switch.

With further reference to the TDM system (500A) according to the present disclosure, shown in FIG. 5A, open or close positions of the pair of shunting switches, EN_Rx, can affect an impedance at ports CPL and DIR of the hybrid coupler (3502) and in turn affect RF signals reflected from these ports. This is used to selectively redirect RF power (i.e., input RF signal) at the antenna (150) to the input of the LNA amplifier (120) during a reception phase of the TDM system (500A) with a reduced loss when compared to the prior art system using a T/R switch (e.g., FIG. 4). Additionally, since no T/R switch is used in the TDM system (500A), RF power loss and mismatch issues caused by such T/R switch can be avoided. Finally, as there is no direct conduction path between the antenna (150) and the input of the LNA amplifier (120), ESD protection to the input of the LNA amplifier (120) is provided by the TDM system (500A).

Figure 2:
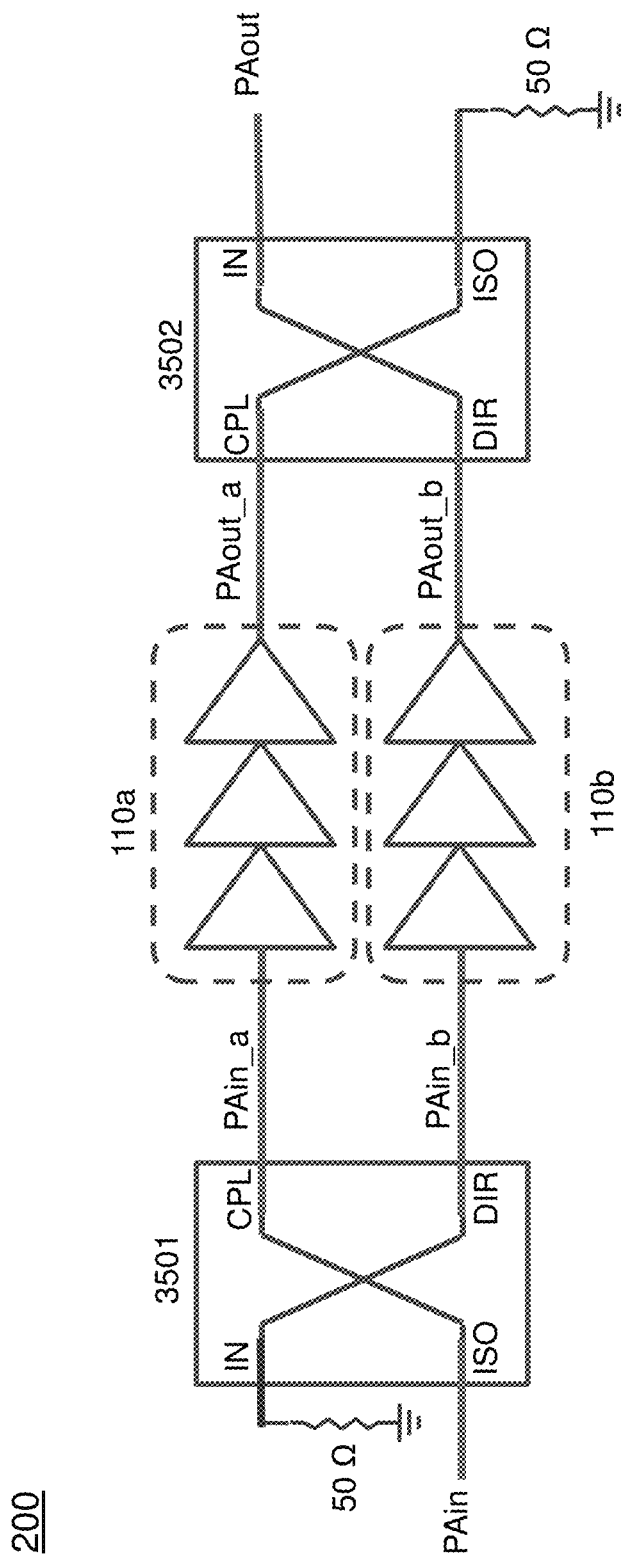
FIG. 2 shows a block diagram of a prior art (ninety-degree) balanced amplifier comprising an input stage hybrid coupler, an output stage hybrid coupler, and two substantially identical amplifiers.
Figure 3:
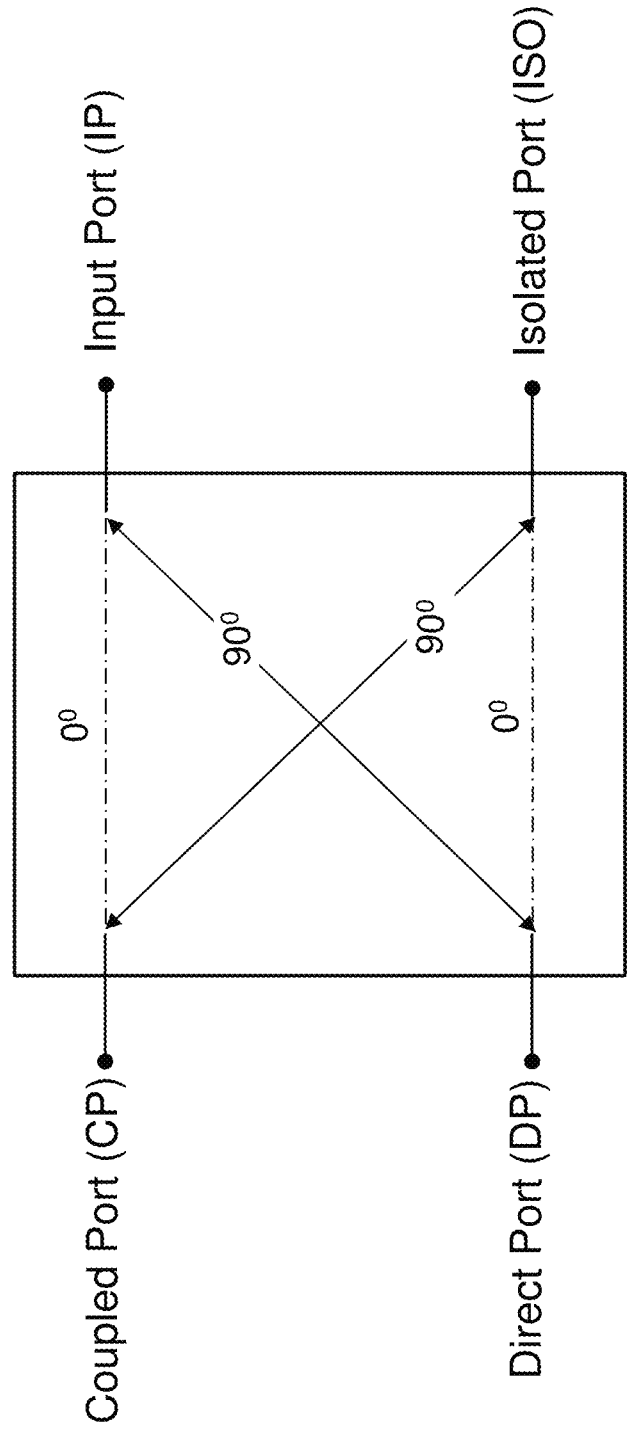
FIG. 3 shows a prior art hybrid coupler.
Figure 5B:
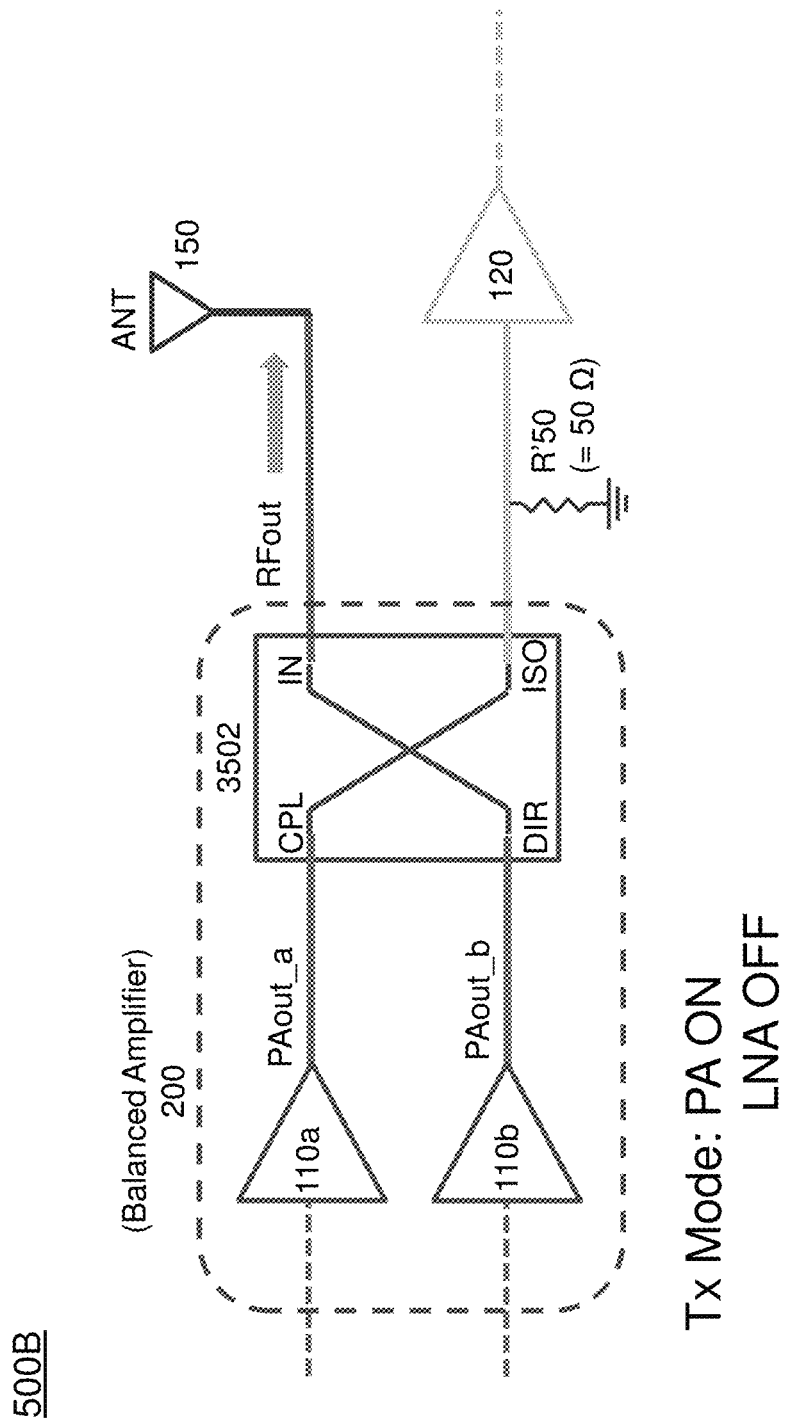
FIG. 5B shows the TDM system of FIG. 5A during a transmission phase of the TDM system.

FIG. 5B shows the TDM system of FIG. 5A during a transmission phase of the TDM system. During the transmission phase, each of the pair of shunting switches, EN_Rx, is in its respective open state, and therefore equivalent to a high impedance conduction path that is represented in FIG. 5A as an open. On the other hand, the shunting EN_Tx switch is closed, and therefore represented in FIG. 5B as an equivalent resistance R'50 with a value that is equal to a sum of the ON resistance of the switch EN_Tx and the resistance of the series-connected resistor R50. According to a non-limiting exemplary embodiment of the present disclosure, and as shown in FIG. 5B, the resistance value of R50 can be chosen so that the equivalent resistance R'50 is substantially equal to 50 Ohms. A person skilled in the art will recognize that the configuration of FIG. 5B is similar to the prior art configuration shown in FIG. 2 described above, and therefore all advantages provided by such prior art configuration are maintained during operation in the transmission phase of the TDM system (500A) according to the present teachings. A person skilled in the art would appreciate that, as can be seen in FIG. 5B, power from the output of the balanced amplifier (200) is delivered directly to the antenna (150) and without being subjected to an attenuation path such as one provided by the T/R switch of the prior art.

With continued reference to FIG. 5B, the quadrature amplified signals at nodes PAout_a and PAout_b, respectively coupled to ports CPL and DIR of the hybrid coupler (3502), divide substantially equally at ports IN and ISO with phase relationships so to constructively combine at the IN port of the hybrid coupler (3502) to provide the RFout signal transmitted at the antenna (150), and destructively cancel at the ISO port. Furthermore, any residual (non-canceled) signal at the ISO port due, for example, to unmatched amplifiers and/or couplers of the balanced amplifier (200), is terminated (e.g., dissipated) into the resistance R'50.

Figure 5C:
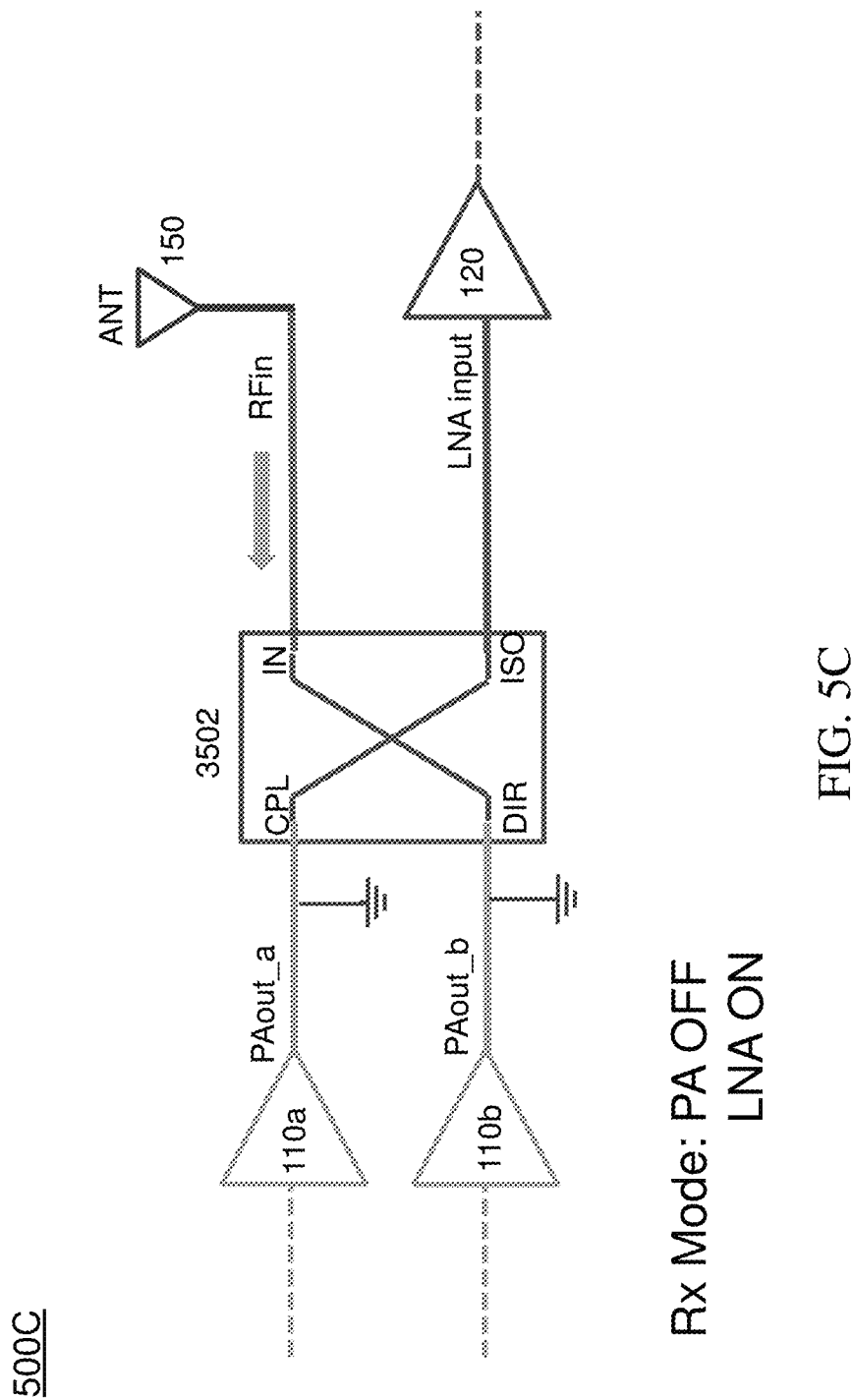
FIG. 5C shows the TDM system of FIG. 5A during a reception phase of the TDM system.

FIG. 5C shows the TDM system of FIG. 5A during a reception phase of the TDM system. During the reception phase, each of the pair of shunting switches, EN_Rx, is in its respective closed state, and therefore equivalent to a low impedance conduction path that is represented in FIG. 5A as a short. On the other hand, the shunting EN_Tx switch is open, and therefore represented in FIG. 5B as an equivalent high impedance open. Accordingly, an RFin signal received at the antenna (150) is coupled to the IN port of the hybrid coupler (3502) and divided equally at ports CPL and DIR of the coupler. In turn, such divided and in quadrature signals at ports CPL and DIR are reflected to the ISO port where they constructively combine to form an RF signal as input RF signal to the LNA amplifier (120). Because the divided signals reflected at ports CPL and DIR each see a same and substantially equal impedance of zero Ohms (at a frequency of operation of the RF signal), no additional phase shift beyond the ninety degrees phase shift provided by the coupler (3502) is provided to the input RF signal. A person skilled in the art would understand that additional phase shift to the input RF signal may be provided by selecting non-zero impedances at the reflective ports CPL and DIR as described, for example, in the above referenced U.S. patent application Ser. No. 15/855,901, the disclosure of which is incorporated herein by reference in its entirety.

Figure 5D:
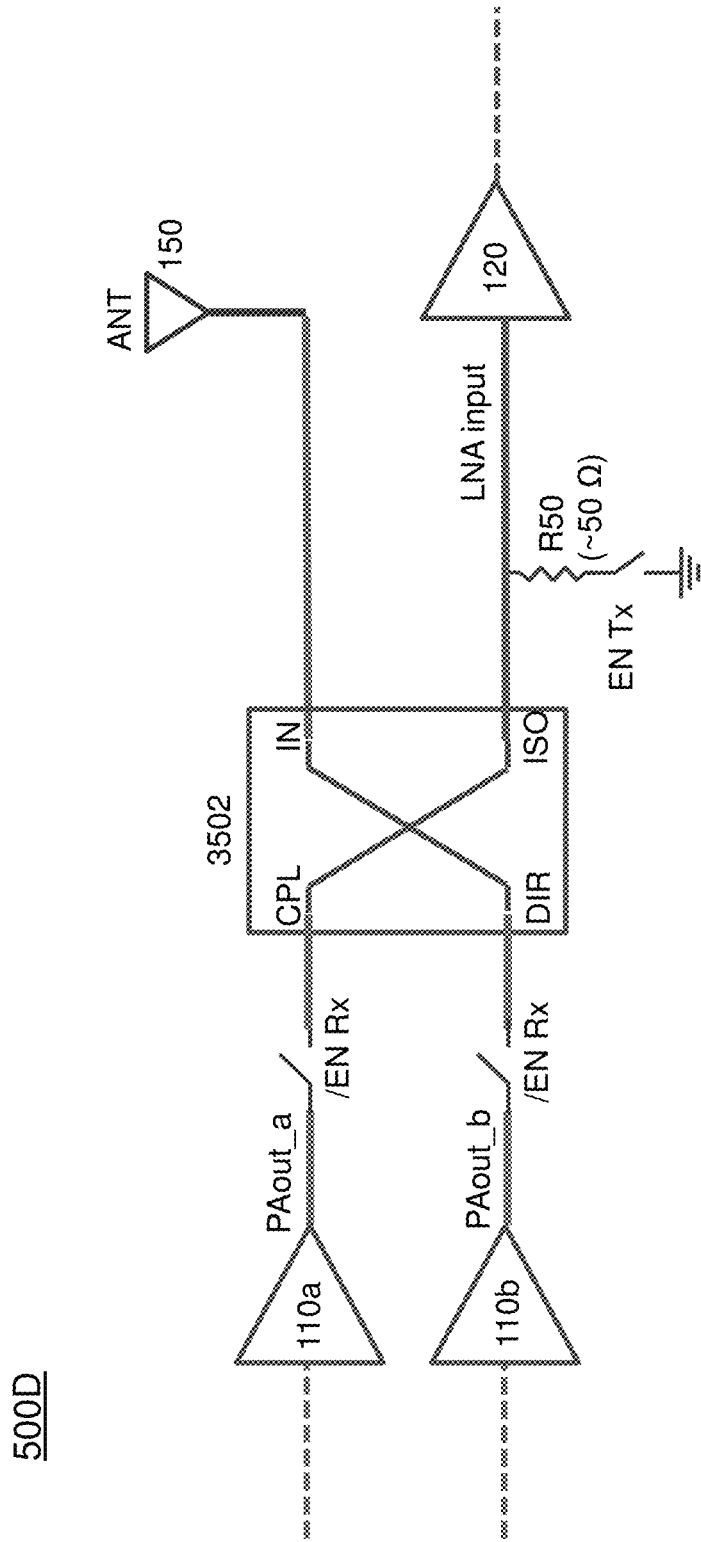
FIG. 5D shows a block diagram of a TDM system according to another embodiment of the present disclosure comprising a balanced amplifier whose output stage hybrid coupler performs the task of a T/R switch.

FIG. 5D shows a block diagram of a TDM system (500D) according to an embodiment of the present disclosure comprising a balanced amplifier (200) whose output stage hybrid coupler (3502) performs the task of the T/R switch (130) discussed above in reference to the prior art. A person skilled in the art clearly realizes that the configuration (500D) shown in FIG. 5D is identical to the configuration (500A) shown in FIG. 5A, with the exception that operation of the hybrid coupler (3502) of the configuration (500D) is controlled via a pair of series switches (i.e., /EN_RX), instead of the pair of shunting switches (i.e., EN_RX) of the configuration (500A), coupled to the respective ports (CPL, DIR) of the hybrid coupler (3502). As can be seen in FIG. 5D, each of the pair of the series switches, /EN_RX, is in series-connection between an output of an amplifying device, (110a) or (110b), and a respective port, CPL or DIR, of the coupler (3502).

Figure 5E:
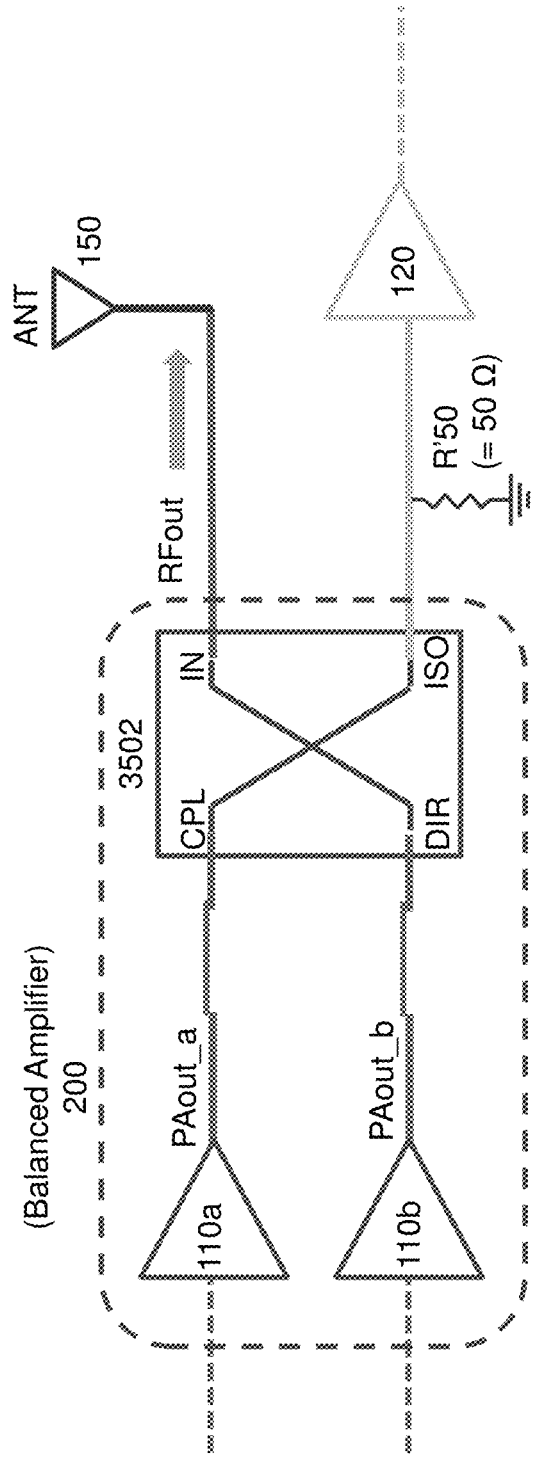
FIG. 5E shows the TDM system of FIG. 5D during a transmission phase of the TDM system.

As shown in the configuration (500E) of FIG. 5E, during the transmission phase of the TDM system (500D), each of the pair of series switches, /EN_RX, is in its respective closed state, and therefore equivalent to a low impedance conduction path that is represented in FIG. 5E as a short. Accordingly, during the transmission phase of the TDM system (500D), the closed state of each of the pair of series switches, /EN_RX, provides a low impedance coupling between respective nodes PAout_a and PAout_b, and ports CPL and DIR. In other words, considering the configurations of FIGS. 5A-5B described above, and of FIGS. 5D-5E, the pair of switches, EN_RX or/EN_RX, are configured to respectively couple amplified phase-shifted signals of the balanced amplifier (i.e., output at PAout_a and PAout_b) to the first port, CPL, and the second port, DIR. In this case, the pair of switches EN_RX couple the amplified phase-shifted signals while configured in their respective OFF (open) states so as to maintain flow of the amplified phase-shifted signals from outputs PAout_a and PAout_b to respective ports CPL and DIR. On the other hand, the pair of switches/ EN_RX couple the amplified phase-shifted signals while configured in their respective ON (closed) states so as to create a conduction path for flow of the amplified phase-shifted signals from outputs PAout_a and PAout_b to respective ports CPL and DIR.

A person skilled in the art would clearly realize that the configuration (500E) resistively couples the nodes PAout_a and PAout_b to respective ports CPL and DIR, and therefore may not include a capacitive loading (e.g., shunt capacitance) present in the configuration (500B) shown in FIG. 5B, the capacitive coupling due to open state capacitance of the shunted switches (EN_RX). Accordingly, the present teachings can provide a choice between a lower capacitance in the transmit path per the configuration (500E) shown in FIG. 5E, or a lower resistance in the transmit path per the configuration (500B) shown in FIG. 5B, while maintaining a same principle of operation: control via a pair of switches coupled to respective ports (CPL, DIR) of the hybrid coupler (3502), the pair of switches presenting to said ports, substantially identical impedances during the transmission phase, and substantially identical impedances during the reception phase.

Figure 5F:
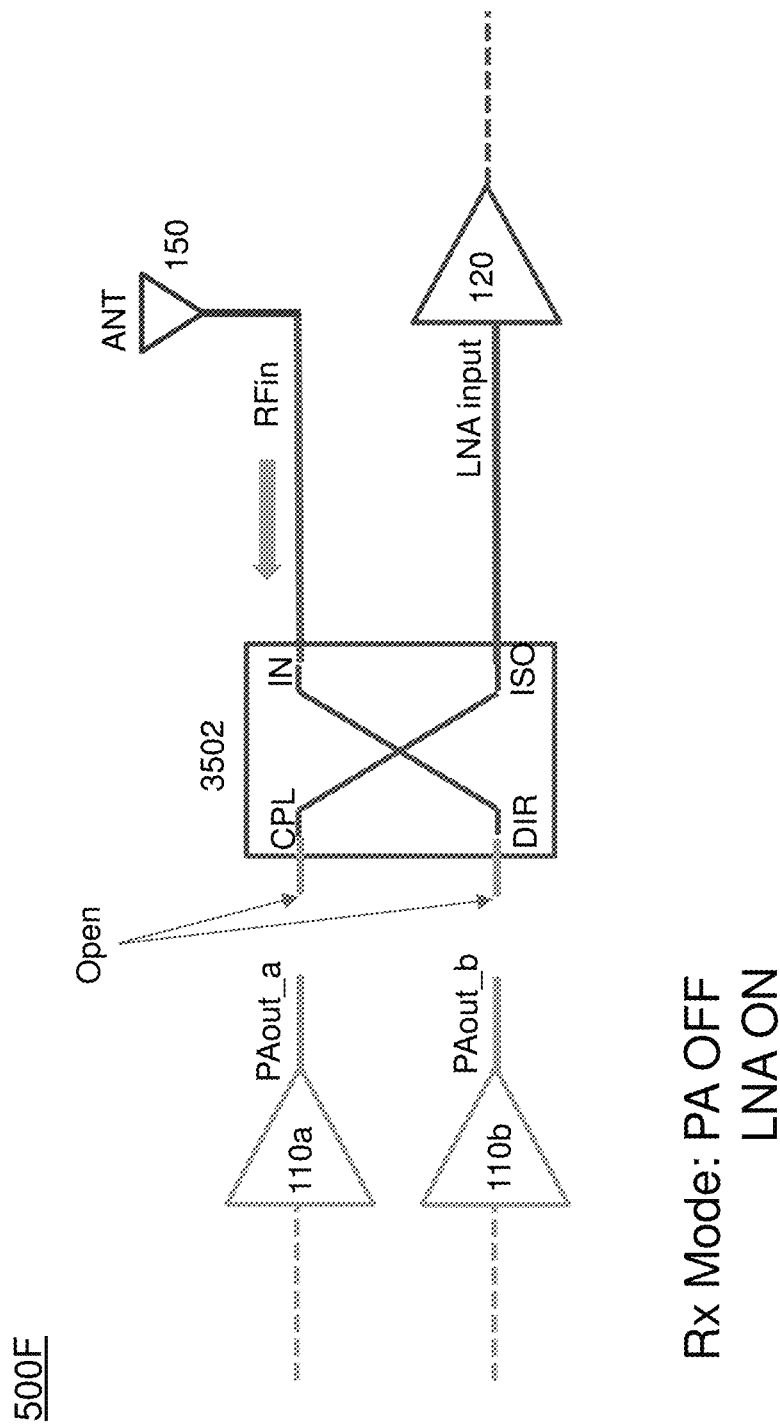
FIG. 5F shows the TDM system of FIG. 5D during a reception phase of the TDM system.

As shown in the configuration (500F) of FIG. 5F, during the reception phase of the TDM system (500D), each of the pair of series switches, /EN_RX, is in its respective open state, and therefore equivalent to an open (e.g., very high impedance) path that is represented in FIG. 5F as an open circuit. Accordingly, during the reception phase of the TDM system (500D), the open state of each of the pair of series switches, /EN_RX, provides a very high impedance coupling between respective nodes PAout_a and PAout_b, and ports CPL and DIR. In other words, the pair of series switches (/EN_RX) substantially isolate the nodes PAout_a and PAout_b from ports CPL and DIR. In other words, considering the configurations of FIGS. 5A and 5C described above, and of FIGS. 5D and 5F, the pair of switches, EN_RX or/EN_RX, are configured to respectively decouple amplified phase-shifted signals of the balanced amplifier (i.e., output at PAout_a and PAout_b) from the first port, CPL, and from the second port, DIR. In this case, the pair of switches EN_RX decouple the amplified phase-shifted signals while configured in their respective ON (close) states by redirecting the flow of the amplified phase-shifted signals from outputs PAout_a and PAout_b to the reference ground via a short. On the other hand, the pair of switches/EN_RX decouple the amplified phase-shifted signals while configured in their respective OFF (open) states by removing a conduction path (e.g., open circuit) for flow of the amplified phase-shifted signals between outputs PAout_a and PAout_b, respective ports CPL and DIR.

The present teachings can provide a choice between a (very) high impedance (e.g., open circuit) coupled to each of the ports (CPL, DIR) in the receive path per the configuration (500F) shown in FIG. 5F, or a (very) low resistance (e.g., short circuit to the reference ground) coupled to each of the ports (CPL, DIR) in the receive path per the configuration (500C) shown in FIG. 5C. A person skilled in the art would clearly realize that such (substantially) identical (very) high or low impedances/resistances (e.g., open or short) coupled to the ports (CPL, DIR) during the reception phase of the TDM system (e.g., 500A or 500D) allow substantially all of a received signal energy (e.g., through the antenna 150) to be reflected by the ports (CPL, DIR), and therefore minimize loss in the reception path. In other words, the configurations (500C) and (500F) have a return loss that approaches 0 dB, such as, for example, 1 dB or lower. It should be noted that as clearly understood by a person skilled in the art, teachings according to the present disclosure may equally apply to configurations that selectively switch in and out substantially identical impedances (that are not necessarily equivalent to an open or a short) to the ports (CPL, DIR) during the receive phase of operation, albeit with higher return loss.

Figure 6A:
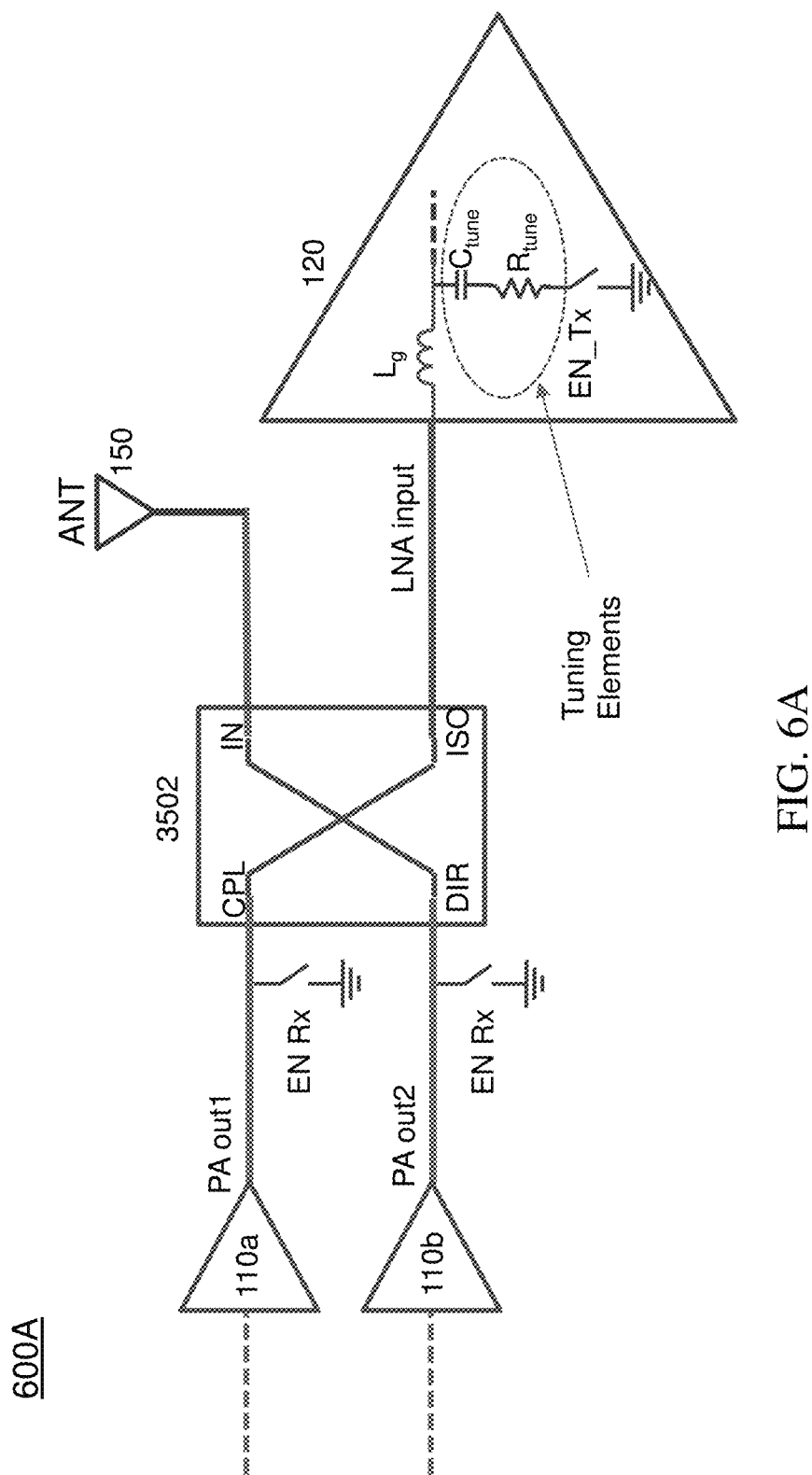
FIG. 6A shows an exemplary embodiment according to the present disclosure of the TDM system of FIG. 5A, where tuning elements are used in the receive path to adjust an impedance seen by the output stage hybrid coupler looking into the receive path.

With reference back to FIG. 5B or FIG. 5E, a person skilled in the art would understand that in a practical implementation, an input impedance of the LNA amplifier (120) at a frequency of operation of the RF signal when the LNA amplifier is deactivated (e.g., during the transmission phase) may not be infinite, or several orders of magnitude higher than the terminating resistance R'50, and therefore may combine with the terminating resistance R'50 to effectively provide an impedance seen by the port ISO looking into the LNA amplifier (120) that is different from a desired system impedance, such as, for example, 50 Ohms. In turn, such mismatch in termination impedance at the ISO port can deteriorate a return loss performance at the antenna (150). It follows that according to a further embodiment of the present disclosure, tuning of a termination impedance at the ISO port can be provided substituting the combination of the EN_TX switch and the series-connected resistor R50 shown in FIG. 5A (or FIG. 5D), by a combination of a similar shunting EN_TX switch in series connection with a resistor, $R_{tune}$, and a capacitor, $C_{tune}$, as shown in FIG. 6A. It should be noted that the forgoing description with reference to FIGS. 6A-6F, 7A-7C and 8B-8C may arbitrarily refer to the configuration (500A) of FIG. 5A, wherein operation of the hybrid coupler (e.g., 3502) is controlled via a pair of shunted switches (e.g., EN_RX) coupled to the ports (CPL, DIR) of said hybrid coupler. A person skilled in the art would clearly understand that the forgoing description equally applies to the configuration (500D) of FIG. 5D, wherein operation of the hybrid coupler (e.g., 3502) is controlled via a pair of series switches (e.g., /EN_RX) coupled to the ports (CPL, DIR) of said hybrid coupler.

FIG. 6A shows an exemplary embodiment according to the present disclosure of a TDM system (600A) based on the TDM system (500A) of FIG. 5A, where tuning elements are used in the receive path to adjust an impedance seen at the ISO port of the hybrid coupler (3502) looking into the LNA amplifier (120) of the receive path. In particular, FIG. 6A shows some internal details of the LNA amplifier (120), including an input inductance Lg of the LNA amplifier (120) that is inherent to the design of such amplifier. A person skilled in the art is well aware of LNA design practices where such input inductance Lg is commonly used, for example, in the input match of a common source LNA.

Figure 6B:
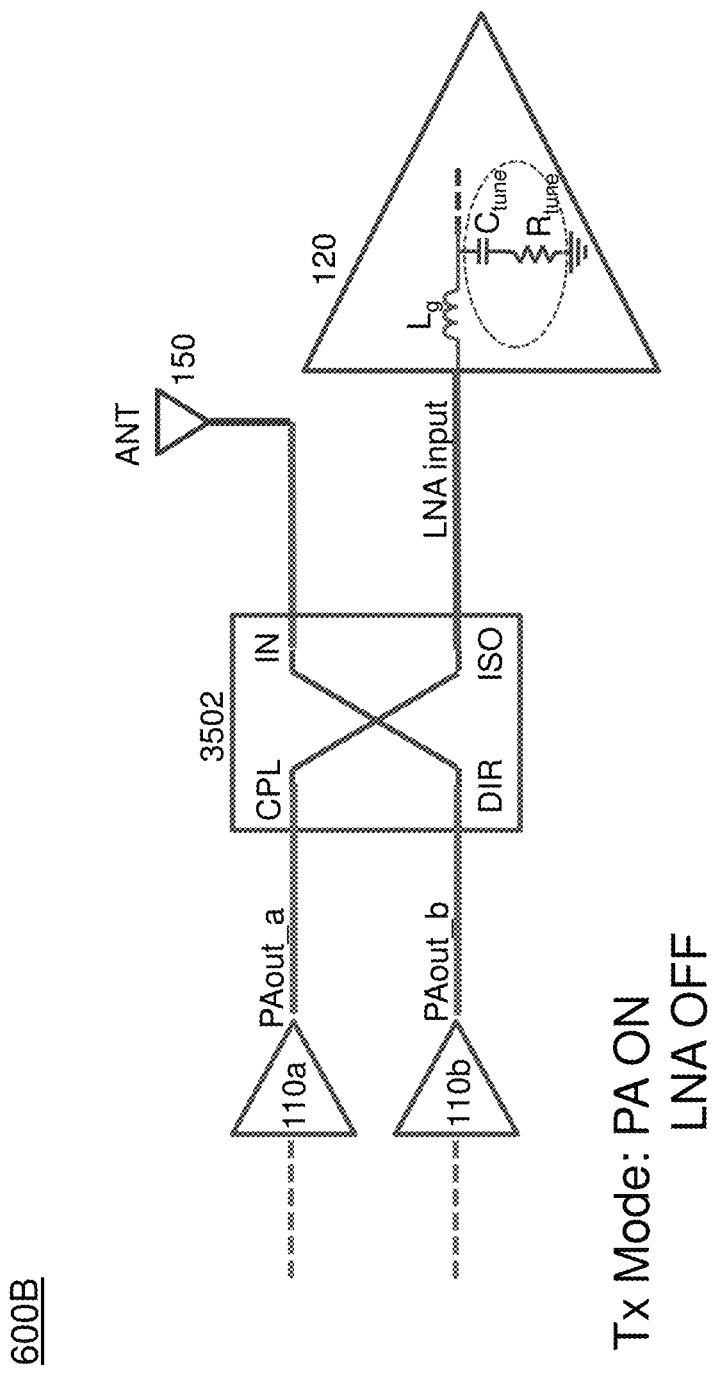
FIG. 6B shows the TDM system of FIG. 6A during a transmission phase of the TDM system.
Figure 6C:
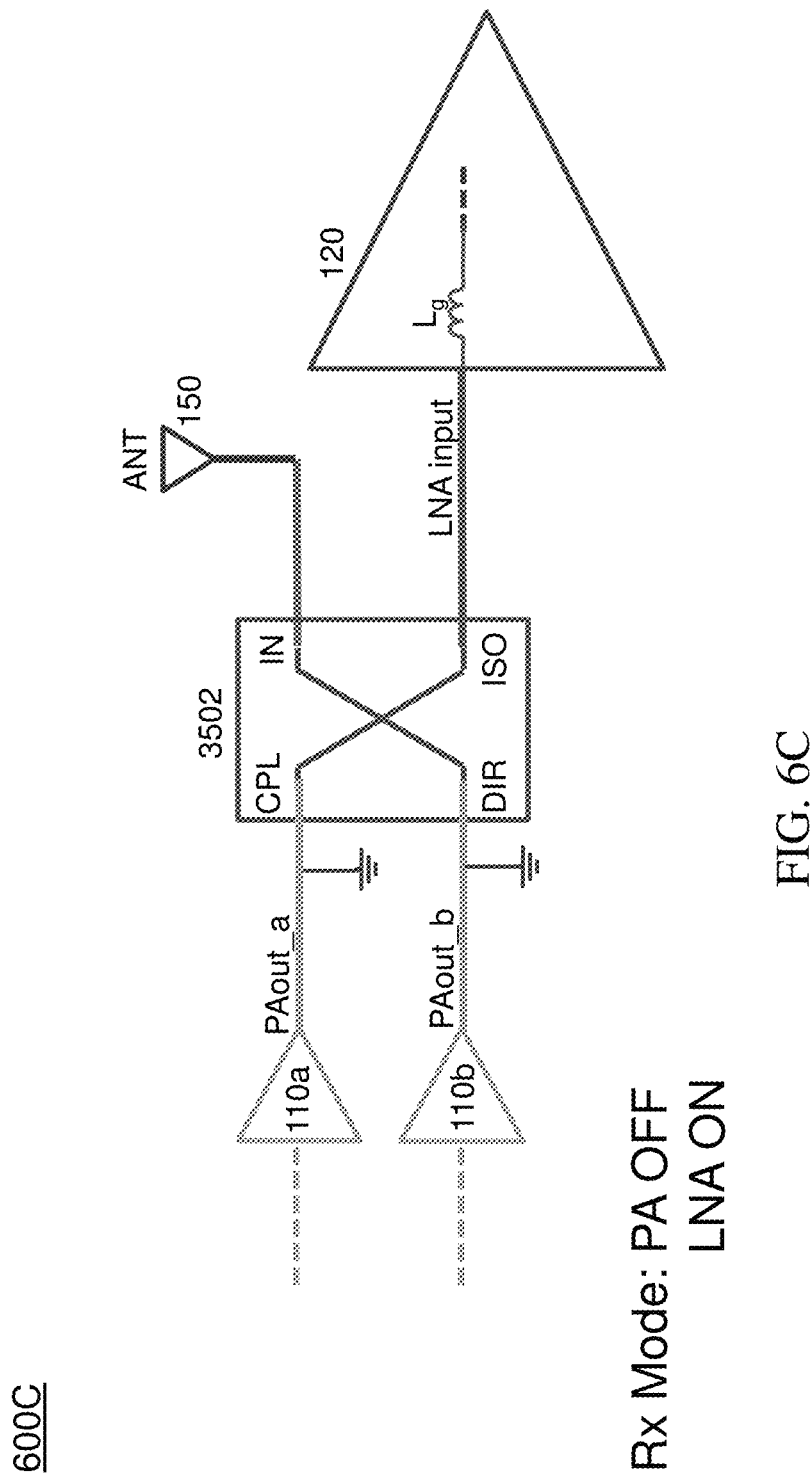
FIG. 6C shows the TDM system of FIG. 6A during a reception phase of the TDM system.
Figure 6D:
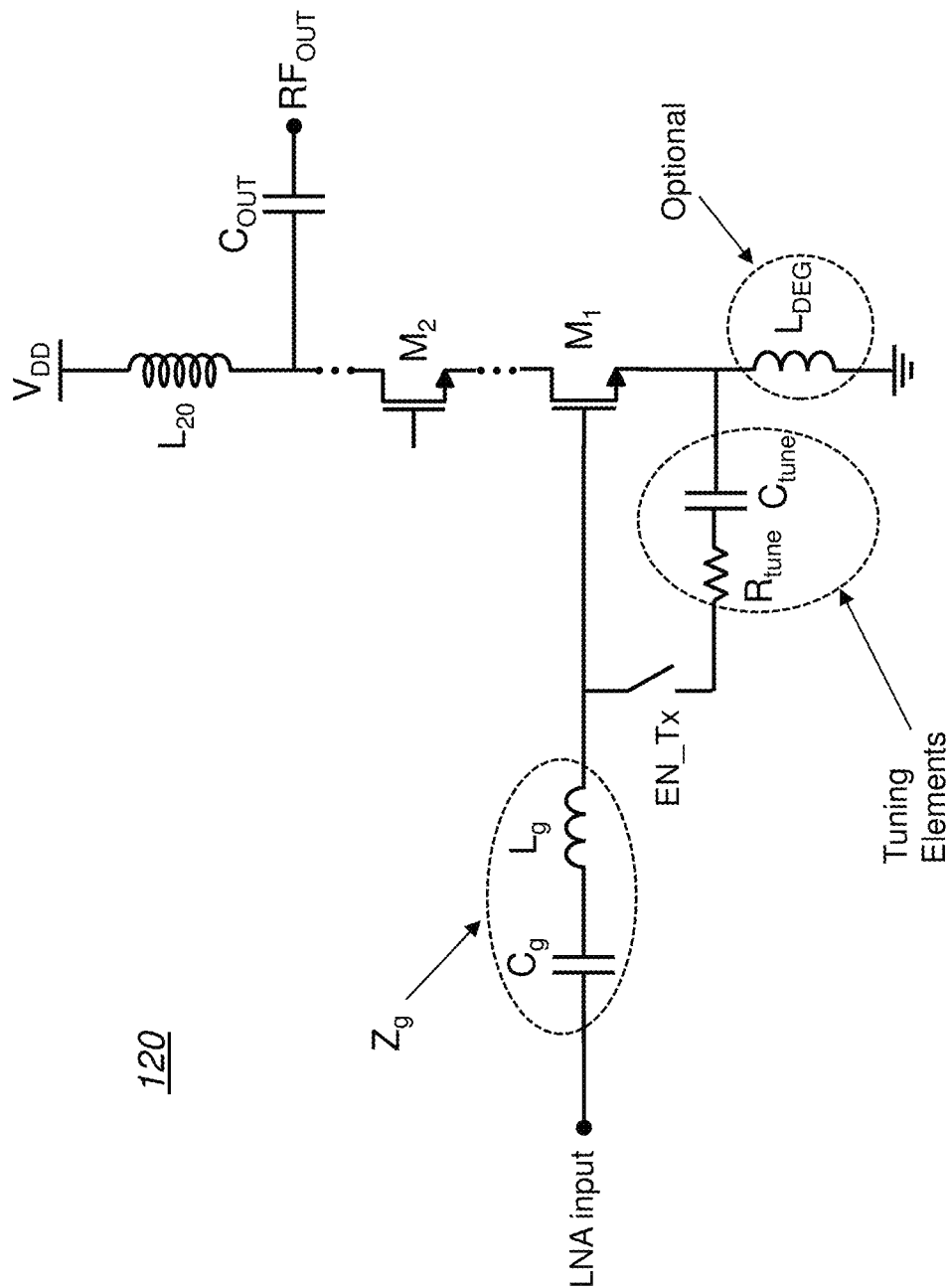
FIG. 6D shows tuning elements coupled to a low noise amplifier (LNA) in a receive path, the tuning elements used to adjust an impedance seen by the output stage hybrid coupler of FIG. 5A or FIG. 5D looking into the receive path.

As shown in FIG. 6D, in some cases, the input inductance of LNA amplifier (120) may be in series connection with a (decoupling) capacitor, Cg, that allows decoupling of DC voltages, used for example to bias the LNA amplifier (120), from an RF signal at the LNA input terminal of the LNA amplifier (120). Furthermore, as shown in FIG. 6D, an input transistor of the LNA amplifier (120) may have a source that is coupled to the reference ground via an optional degeneration inductor, $L_{DEG}$.

With continued reference to FIG. 6A, the combination of the series-connected tuning elements, comprising the resistor $R_{tune}$, and the capacitor, $C_{tune}$, in series-connection with the shunting EN_TX switch, is coupled to the input inductance Lg at a node that is away from the ISO port of the hybrid coupler (3502). A person skilled in the art would know that many different LNA topologies, input matching networks, and thus input impedances are possible. The teachings according to the present disclosure equally apply to such different topologies, including the topology shown in FIG. 6D, wherein a tuning circuit provides a net input impedance approximating a desired termination resistance when the LNA is in the OFF state and provides a good input match when the LNA is in the ON state.

As shown in FIG. 6B, during the transmission phase of operation of the TDM system of FIG. 6A, an impedance seen at the ISO port of the hybrid coupler (3502) is a resistive-reactive impedance provided by series connection of the inductance Lg and the tuning elements $R_{tune}$ and $C_{tune}$. A person skilled in the art would appreciate the flexibility in tuning of such resistive-reactive impedance, which clearly can provide, by selecting appropriate values of the tuning elements, a desired terminating impedance at the ISO port of the hybrid coupler (3502) at the frequency of operation. Selection of the appropriate values may be based on circuit simulation and/or effective in circuit measurements, or any other known methods to a person skilled in the art. Alternatively, or in addition, the tuning elements $R_{tune}$ and $C_{tune}$ may be in-circuit programmable, adjustable, settable, or controllable elements via any circuits known to a person skilled in the art.

As shown in FIG. 6B, the series-connected tuning elements, comprising the resistor $R_{tune}$, and the capacitor, $C_{tune}$, are coupled between the inductance Lg and the reference ground. Such configuration may refer to an LNA amplifier (120) configuration having a source node of an input transistor that is directly coupled to the reference ground. One such exemplary configuration may be provided by the LNA amplifier (120) of FIG. 6D without the optional degeneration inductor, $L_{DEG}$. For configurations including a degeneration inductance, such as the configuration shown in FIG. 6D, according to an exemplary embodiment of the present disclosure, the series-connected tuning elements ($R_{tune}$, $C_{tune}$) may be (selectively, via the tune, shunting switch EN_TX) coupled between the inductance Lg and a terminal of the degeneration inductance, $L_{DE}G$, that is away from the reference ground. In other words, as shown in FIG. 6D, irrespective of presence or not of a degeneration inductance, $L_{DE}G$, the series-connected tuning elements ($R_{tune}$, $C_{tune}$) may be (selectively) coupled between a gate of an input transistor M1 of the LNA amplifier (120) and a source of the input transistor M1. A person skilled in the art would clearly realize that arrangement of the shunting switch, EN_TX, to provide selective coupling (and decoupling) of the series-connected elements ($R_{tune}$, $C_{tune}$), can be modified with respect to the arrangement shown in FIG. 6D without impact in operation. In other words, a sequence in the series connection of the elements (EN_TX, $R_{tune}$, $C_{tune}$) shown in FIG. 6D may be modified. Furthermore, it should be noted that arrangement of the series-connected tuning elements ($R_{tune}$, $C_{tune}$) in a configuration where the degeneration inductor, $L_{DEG}$, is present, may also be provided according to the configuration shown in FIG. 6B, In other words, the LNA amplifier (120) shown in FIG. 6B may include a degeneration inductor, $L_{DEG}$.

FIG. 6C shows configuration during the reception phase of operation of the TDM system of FIG. 6A. In this case, as the shunting switch EN_TX is open, no low impedance conduction path to ground (e.g., AC ground) can be provided to the series-connected tuning elements $R_{tune}$ and $C_{tune}$, and therefore such elements become effectively decoupled (as no current flows through them) from a signal path comprising the Lg inductance. It follows that the tuning element do not affect the received RF signal during the reception phase of operation of the TDM system shown in FIG. 6A.

With reference back to FIG. 6D, the figure shows a simplified schematic of an exemplary LNA amplifier (120), including an input transistor M1. As can be seen in FIG. 6D, the input transistor may include a gate node that is coupled to the LNA input node through a series-connected impedance Zg, the series-connected impedance comprising the inductor Lg and a capacitor Cg. Furthermore, the input transistor may include a source node that is coupled to the reference ground through an optional degeneration inductance, $L_{DEG}$. The input transistor M1 amplifies an RF signal presented at the LNA input node to provide an amplified version of the RF signal at an output node, $R_{FOUT}$, of the LNA amplifier (120), the output node coupled to a drain node of the input transistor, M1. As shown in FIG. 6D, biasing of the input transistor, M1, may be provided by a supply voltage, $V_{DD}$, that is coupled to the drain node of the input transistor, M1, through an inductor (choke), $L_{20}$. A person skilled in the art would clearly realize that in a case where the LNA amplifier includes a plurality of stacked transistors, the supply voltage, VDD, would be coupled to the top of the stack, or in other words, to the drain of an output transistor of the stack. A DC decoupling capacitor, $C_{OUT}$, may remove a DC biasing voltage provided by the supply voltage, $V_{DD}$, from the output node, $R_{FOUT}$.

As shown in FIG. 6D, the LNA amplifier (120) may include a stacked transistor configuration, also known as a cascode configuration/amplifier, wherein one or more cascode transistors (M2, . . . ) are arranged in series connection between the drain node of the input transistor, M1, and the supply voltage, $V_{DD}$. For example, assuming that the stacked transistor configuration has a stack height of two that includes the input transistor, M1, and the cascode transistor, M2, then the drain node of the input transistor is coupled/connected to a source node of the cascode transistor, M2, and a drain node of the cascode transistor is coupled/connected to the supply voltage, $V_{DD}$, and to the output node, $R_{FOUT}$. In other words, the cascode transistor, M2, may be considered as the output transistor of the LNA amplifier (120). Advantages of using such stacked transistor configuration are well known in the art and outside the scope of the present application.

Figure 6E:
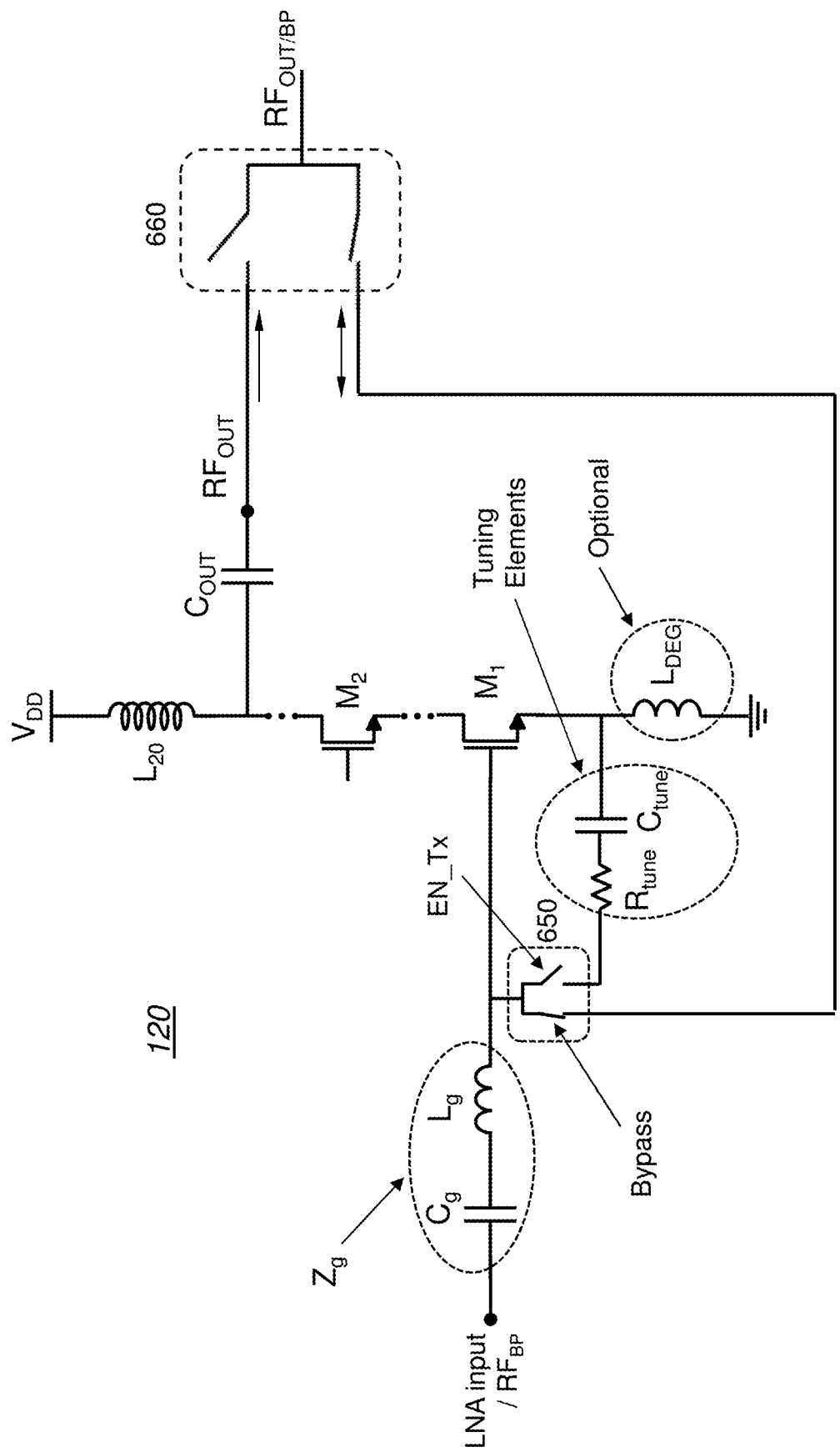
FIG. 6E shows an exemplary embodiment according to the present disclosure of a bypass path.

FIG. 6E shows a configuration based on the configuration described above with reference to FIG. 6D, wherein an additional switch (Bypass) may be used to provide a conduction path that bypasses the LNA amplifier (120). As can be seen in FIG. 6E, the single-pole single-throw Bypass switch selectively bypasses the LNA amplifier (120) by coupling the input to the amplifier to a throw of, for example, a single-pole double-throw switch (660). In turn, the switch (660), whose other throw is coupled to the output of the LNA amplifier (120), may selectively provide a conduction path to a corresponding pole of the switch (660) that is coupled to a node $RF_{OUT/BP}$. For example, when the LNA amplifier (120) is used for amplifying an RF signal received from the common antenna (e.g., 150 of FIG. 5A), the switch Bypass is open and the switch (660) couples the throw coupled to the output of the LNA amplifier (120) to the node $RF_{OUT/BP}$. On the other hand, when the LNA amplifier (120) is bypassed, the switch Bypass is closed (as shown in FIG. 6E) and the switch (660) couples (as shown in FIG. 6E) the throw coupled to the bypass path to the node $RF_{OUT/BP}$.

As shown in FIG. 6E, according to an exemplary embodiment of the present disclosure, the switch Bypass may be coupled at one terminal (e.g., pole or throw) of the switch to a node common to the inductor Lg and the gate of the input transistor M1, and coupled at another terminal of the switch to the switch (660) thereby providing the bypass path. Because of close proximity of the switch Bypass and the switch EN_Tx, such two switches may be integrated to become part of a single-pole double-throw switch (650) as shown in FIG. 6E. Accordingly, as shown in FIG. 6E, the single-pole of the switch (650) may be coupled to the node common to the inductor Lg and the gate of the input transistor M1, and the two throws of the switch (650) may be respectively coupled to the switch (660) and to the tuning elements ($R_{tune}$ and $C_{tune}$). It should be noted that the location of the switch Bypass may not necessarily be restricted to the location shown in FIG. 6E, as the switch Bypass may be coupled to either sides of the series-connected impedance Zg while maintaining substantially same performance of a corresponding bypass path.

With continued reference to FIG. 6E, the bypass path provided by the switch Bypass may be used to receive an RF signal from the common antenna (e.g., 150 of FIG. 5A) or to transmit an RF signal to the common antenna. In other words, the bypass path provided by the switch Bypass may be used to bypass either the LNA amplifier (120) or the balanced amplifier (e.g., 200 of FIG. 5B) to respectively receive or transmit an RF signal from/to the common antenna. The bidirectionality of the bypass path is indicated in FIG. 6E by the double arrow associated to a corresponding throw of the switch (660). It should be noted that the switch (660) may not be limited to the exemplary single-pole double-throw configuration shown in FIG. 6E, as a corresponding configuration may be based on specific design goals. For example, FIG. 6F shows a different switch configuration.

Figure 6F:
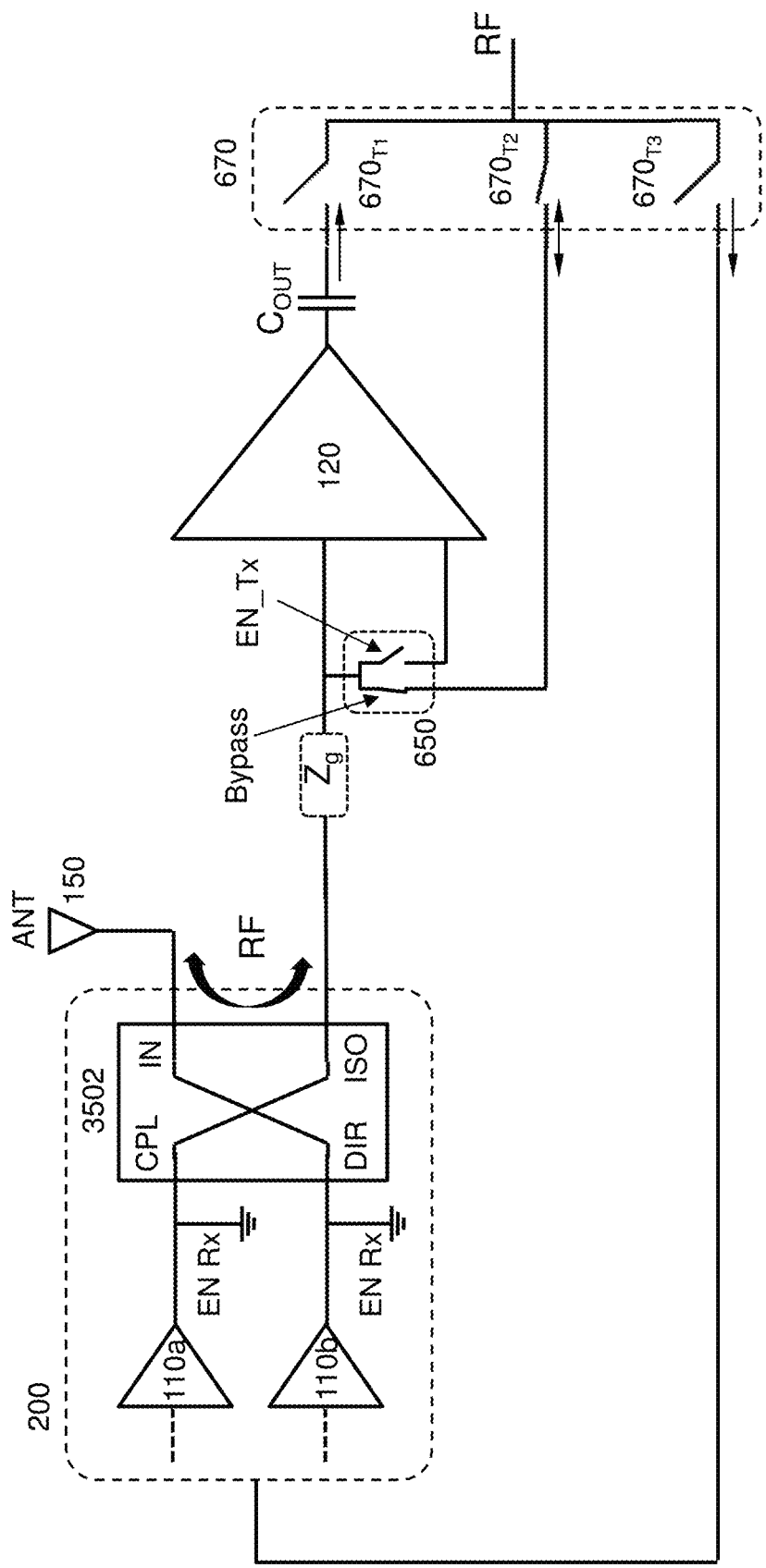
FIG. 6F shows a block diagram of a TDM system according to an embodiment of the present disclosure based on the TDM system of FIG. 5A and comprising a bypass path.

FIG. 6F shows a block diagram of a TDM system according to an embodiment of the present disclosure based on the TDM system of FIG. 5A and comprising the bypass path described above with reference to FIG. 6E. As shown in FIG. 6F, control of a path of an RF signal to/from the common antenna (150) may be based on a position of a switch (670). The switch (670) may selectively couple a common node, RF, coupled to a (single) pole of the switch (670), to throws of the switch (670) respectively coupled to: i) an output of the LNA amplifier (120); ii) the bypass path provided by the switch (650); or iii) an input of the balanced amplifier (200). As described above with reference to FIG.

6E, when coupled to the bypass path, bidirectional operation can be provided to either transmit an RF signal coupled to the common node, RF, via the common antenna (150) while bypassing the balanced amplifier (200), or couple an RF signal received by the common antenna (150) to the common node, RF, while bypassing the LNA amplifier (120). As shown in FIG. 6F, during a bypass mode of operation (RF through the bypass path), the pair of shunting switches, EN_Rx, coupled (i.e., connected) to respective ports CPL and DIR of the hybrid coupler (3502) are in the closed state so to allow reflection of RF signals from the ports CPL and DIR for constructive combining at port ISO (when receiving an RF signal from the antenna through the bypass path) or at port IN (when transmitting an RF signal to the antenna through the bypass path). It is noted that such operation of the hybrid coupler (3502) as a (bidirectional) switch during the bypass mode of operation is enabled by the symmetrical nature of the coupler when configured to reflect RF signals from the port CPL and DIR: an RF signal provided at the port IN is reflected from the ports CPL and DIR to constructively combine at the port ISO, and an RF signal provided at the port ISO is reflected from the ports CPL and DIR to constructively combine at the port IN.

Table 1 below provides exemplary ON and OFF (i.e., closed and open) states of the switches EN_Rx, EN_Tx, Bypass and (670), as well as ON of OFF state (i.e., activated/deactivated, power ON/OFF) of the LNA amplifier (120), for different modes of operation of the TDM system shown in FIG. 6F, including a transmit mode (TX) with amplification via the balanced amplifier (200), a receive mode with amplification via the LNA amplifier (120), and the bypass mode. In Table 1, the switch (670) is represented by equivalent single-pole single throw switches $670_{T1}$, $670_{T2}$ and $670_{T3}$ respectively coupled to (output of) the LNA amplifier (120), the bypass path (e.g., switch Bypass), and (input of) the balanced amplifier (200) as shown in FIG. 6F.

TABLE 1

| Mode | EN_RX | EN_TX | Bypass | LNA | $670_{T1}$ | $670_{T2}$ | $670_{T3}$ |
|---|---|---|---|---|---|---|---|
| TX | OFF | ON | OFF | OFF | OFF | OFF | ON |
| RX | ON | OFF | OFF | ON | ON | OFF | OFF |
| Bypass | ON | OFF | ON | OFF | OFF | ON | OFF |

As noted above, during the transmission phase of operation, mismatch, for example, in the amplifiers (e.g., 110a, 110b) and/or hybrid couplers (e.g., 3501, 3502) of the balanced amplifier, and even in some cases in the antenna (150), used in the TDM system (500A) shown in FIG. 5A, can result in a residual (non-canceled) signal at the ISO port, which is terminated (e.g., dissipated) into the resistance R'50. As power handled by the transmit path and antenna (150) during the transmission phase can be several orders of magnitude larger than power handled by the receive path and antenna (150) during the reception phase, even a fractional part of a transmission power representing the residual signal at the ISO port of the hybrid coupler (3502) can be damaging to the low power circuitry of the LNA amplifier (120). It follows that according to a further embodiment of the present disclosure shown in FIG. 7A, increased isolation between the ISO port of the hybrid coupler (3502) and the input of the LNA amplifier (120) can be provided via insertion of a switchable conduction path (720) between the ISO port of the hybrid coupler (3502) and the input of the LNA amplifier (120).

Figure 7A:
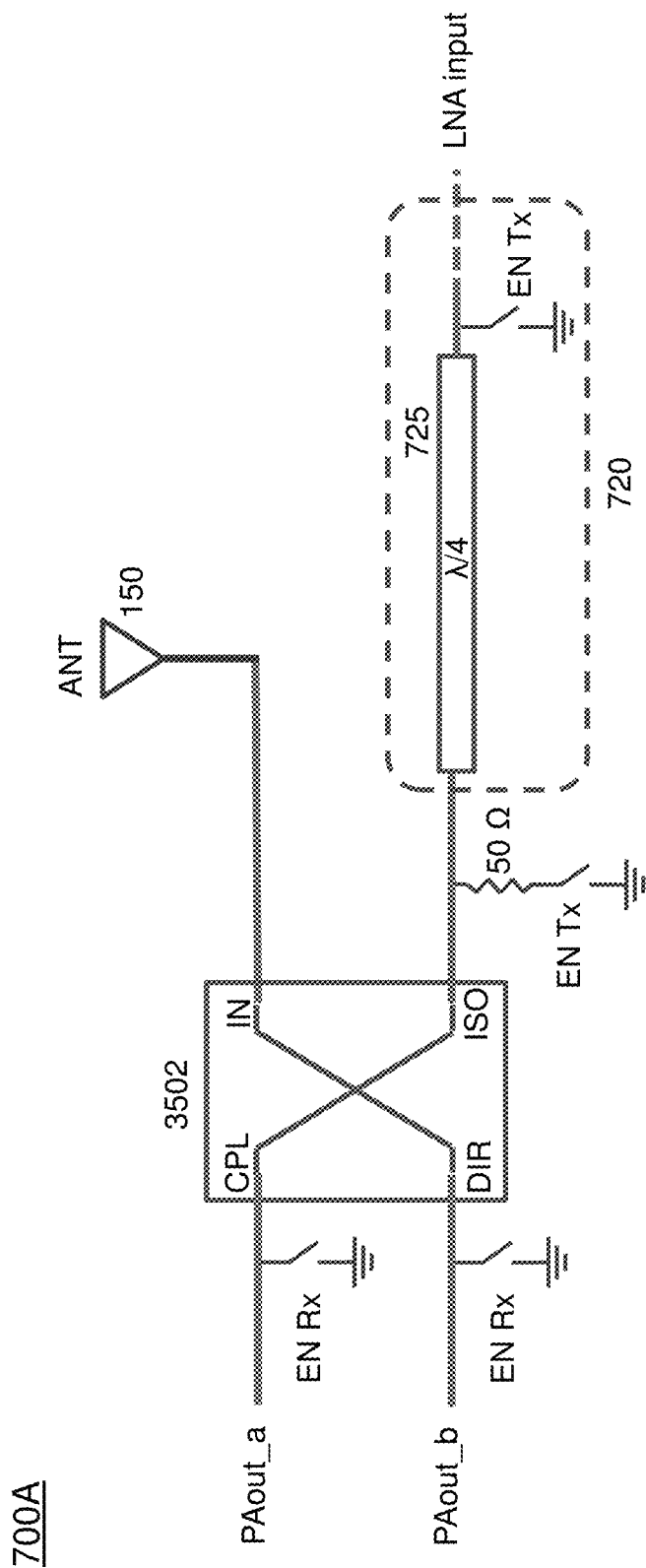
FIG. 7A shows an exemplary embodiment according to the present disclosure of the TDM system of FIG. 5A, where a quarter wavelength transmission line coupled to a switch are used are used in the receive path to further control an impedance seen by the output stage hybrid coupler looking into the receive path.

FIG. 7A shows an exemplary embodiment of a TDM system (700A) according to the present disclosure that is based on the TDM system of FIG. 5A, where a quarter wavelength, ¼ λ, transmission line (725), with λ representing a wavelength corresponding to an operating frequency of the RF signal, is coupled, at one end of the transmission line (725), to the ISO port of the hybrid coupler (3502), and at the other end of the ¼ λ transmission line (725), to the input of the LNA amplifier (120).). A person skilled in the art readily knows of many possible design implementations for such transmission line which are beyond the scope of the present application. A person skilled in the art would realize that operation of the switchable conduction path (720) is according to an SPST switch function, which may also be realized by, for example, adding a series or series and shunt switch, or any other design known to the skilled person. Additionally, it should be noted that although the various embodiments according to the present disclosure do not require a switch in series connection in the receive path, some practical implementation tradeoffs may dictate the addition of such switch.

Figure 7B:
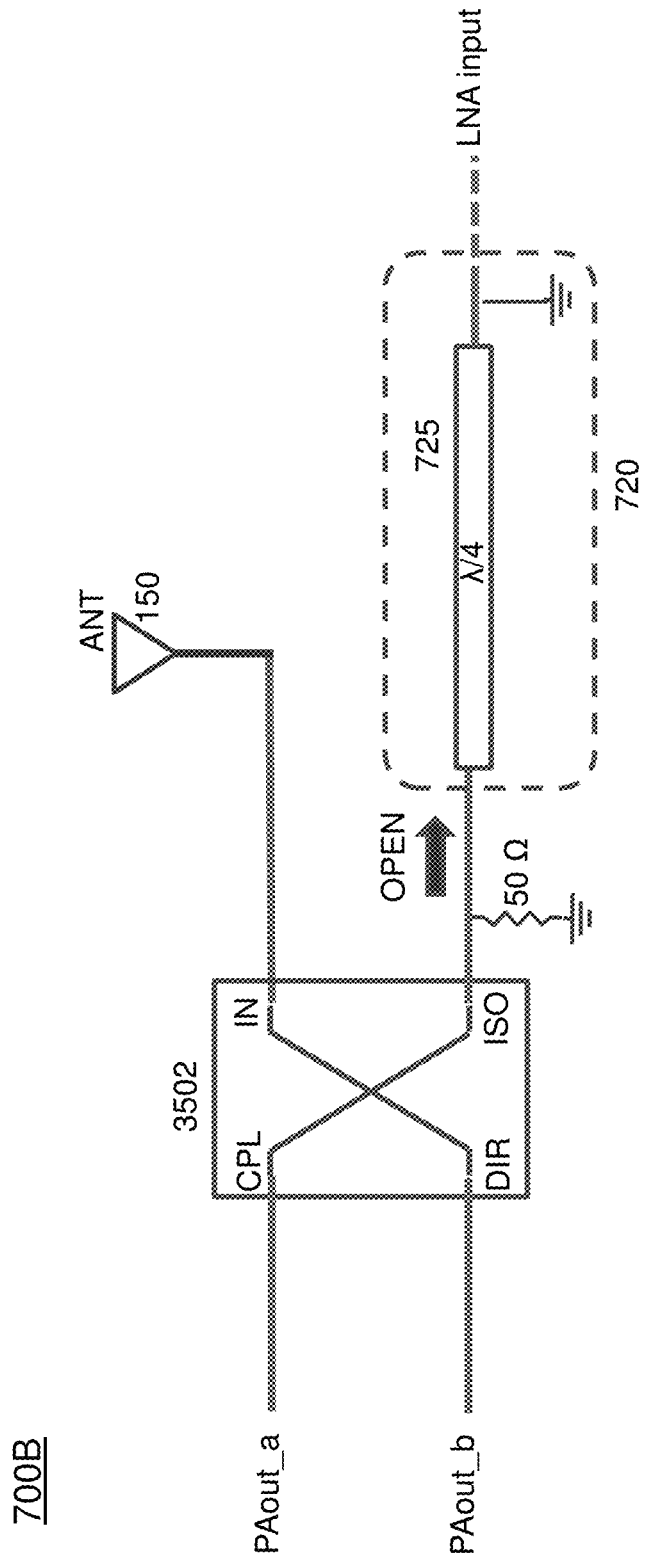
FIG. 7B shows the TDM system of FIG. 7A during a transmission phase of the TDM system.
Figure 7C:
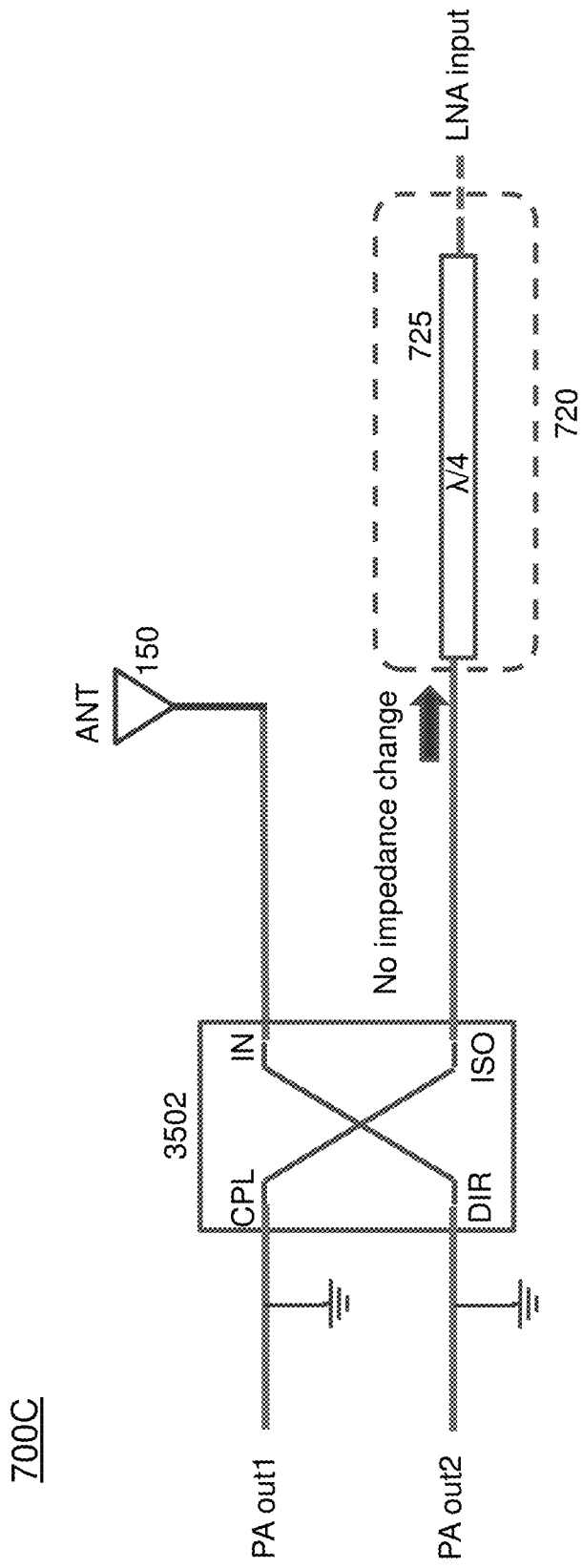
FIG. 7C shows the TDM system of FIG. 7A during a reception phase of the TDM system.

With further reference to FIG. 7A, an additional shunting EN_Tx switch is coupled to the end of the ¼λ transmission line (725) that is coupled to the input of the LNA amplifier (120). A person skilled in the art clearly understands the principle of operation of the switchable conduction path (720) defined by the combination of the ¼λ transmission line (725) coupled to the additional shunting EN_Tx switch. That is, closing the additional shunting EN_Tx switch makes the ISO port see an open circuit (high impedance) through the conduction path leading to the input of the LNA amplifier (120), and opening the additional shunting EN_Tx switch causes the input impedance of the LNA amplifier (120) to be seen through an impedance transformed conduction path between the ISO port and the input of the LNA amplifier (120). Accordingly, as can be seen in FIG. 7B, closing both of the shunting EN_Tx switches during the transmission phase, isolates the input of the LNA amplifier (120) from the ISO port of the hybrid coupler (3502). On the other hand, as can be seen in FIG. 7C, opening both of the shunting EN_Tx switches during the reception phase, provides an equivalent short, or a non-attenuating conduction path (e.g., phase shift but no signal loos), through the switchable conduction path (720) that effectively connects the ISO port and the LNA input.

Figure 1B:
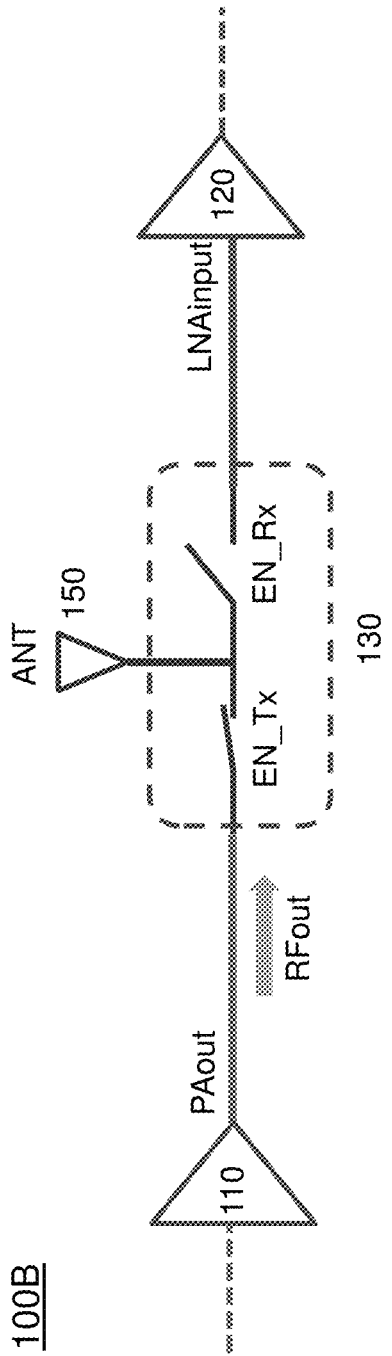
FIG. 1B shows the prior art transmit/receive (T/R) switch during a transmission phase of the TDM system.
Figure 1C:
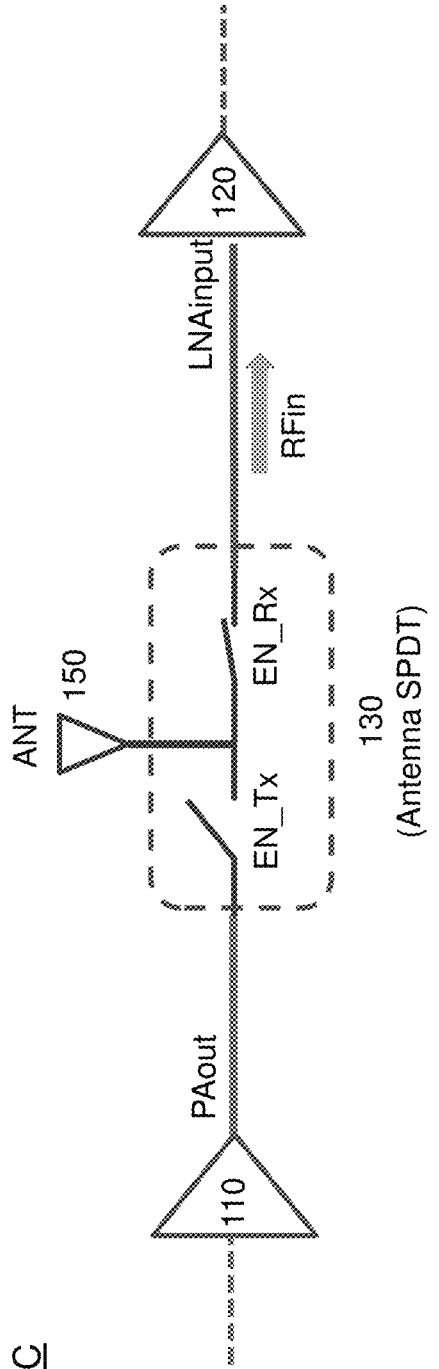
FIG. 1C shows the prior art transmit/receive (T/R) switch during a reception phase of the TDM system.

In some cases, the front end of a TDM system, such as one shown in FIG. 1A, connects to independent transmit and receive paths (connections to amplifiers 110 and 120 not shown). These independent transmit and receive paths may be in a same transceiver IC, but the processing of the signals may be different and by way of processing paths that are usually not shared. However, there may be cases where the transmit and receive paths do share some common elements and therefore common processing paths. An example is, for example, a T/R path of a phased array antenna as known to a person skilled in the art. In this case, a common amplitude and phase control block can be shared by the transmit and receive paths because of the time-division nature of the system. FIG. 8A shows a prior art bi-directional amplifier block (800A) that can be alternately used to transmit signals, via amplifier (110) coupling to the antenna (150), and receive signals, via the amplifier (120) coupling to the antenna (150). The common processing functions for transmitted and received signals, such as, for example, amplitude and phase shift functions, may be performed via a switched connection to a common block (850) that is selectively provided by the common block SPDT switch (830) as shown in FIG. 8A. An example application of such a circuit configuration may be a phase array element controller and front end. The phase shifter, amplitude controller, or both phase and amplitude control could be common to both receive and transmit operation in, for example, a TDD system. These common blocks are then switched to the LNA and PA and eventually to the antenna (150). As a further example, this type of circuit can be used in millimeter wave 5G communication systems or any phased array antenna system.

Figure 8B:
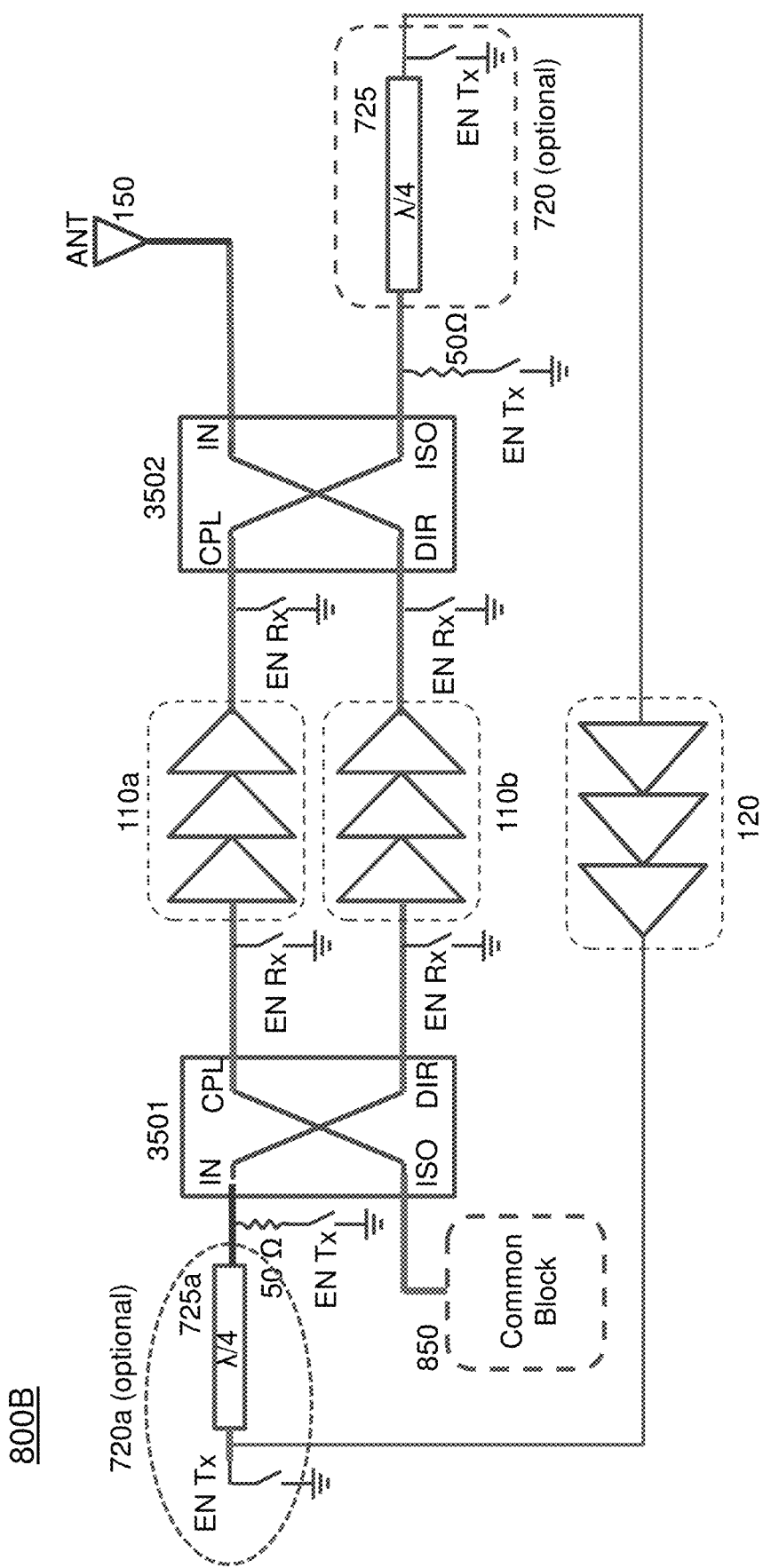
FIG. 8B shows a block diagram of a TDM system according to an embodiment of the present disclosure comprising a balanced amplifier whose input stage hybrid coupler and output stage hybrid coupler each perform the task of a T/R switch.

As discussed above with reference to the prior art configuration of FIG. 1A, similarly to the T/R switch (130), the switch (830) can be a source of performance loss in the configuration depicted in FIG. 8A. It follows, that according to a further embodiment of the present disclosure as shown in FIG. 8B, the input hybrid coupler (3501), which as discussed above with reference to FIG. 2 is part of the prior art balanced amplifier (200), can also be used to perform the task of selectively switching the receive and transmit path RF signals to and from the common block (850).

Figure 8C:
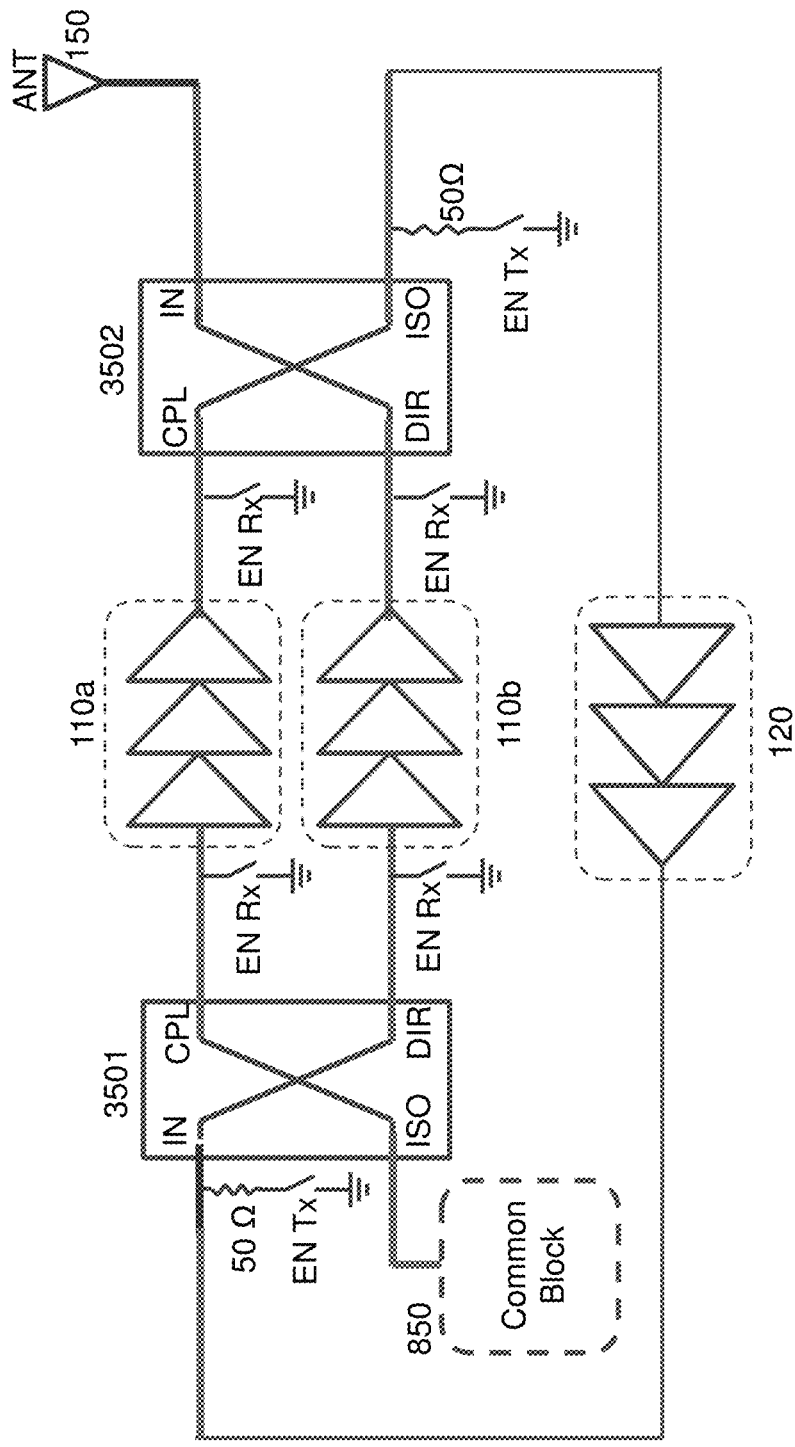
FIG. 8C shows a block diagram of another TDM system according to an embodiment of the present disclosure comprising a balanced amplifier whose input stage hybrid coupler and output stage hybrid coupler each perform the task of a T/R switch.
Figure 8D:
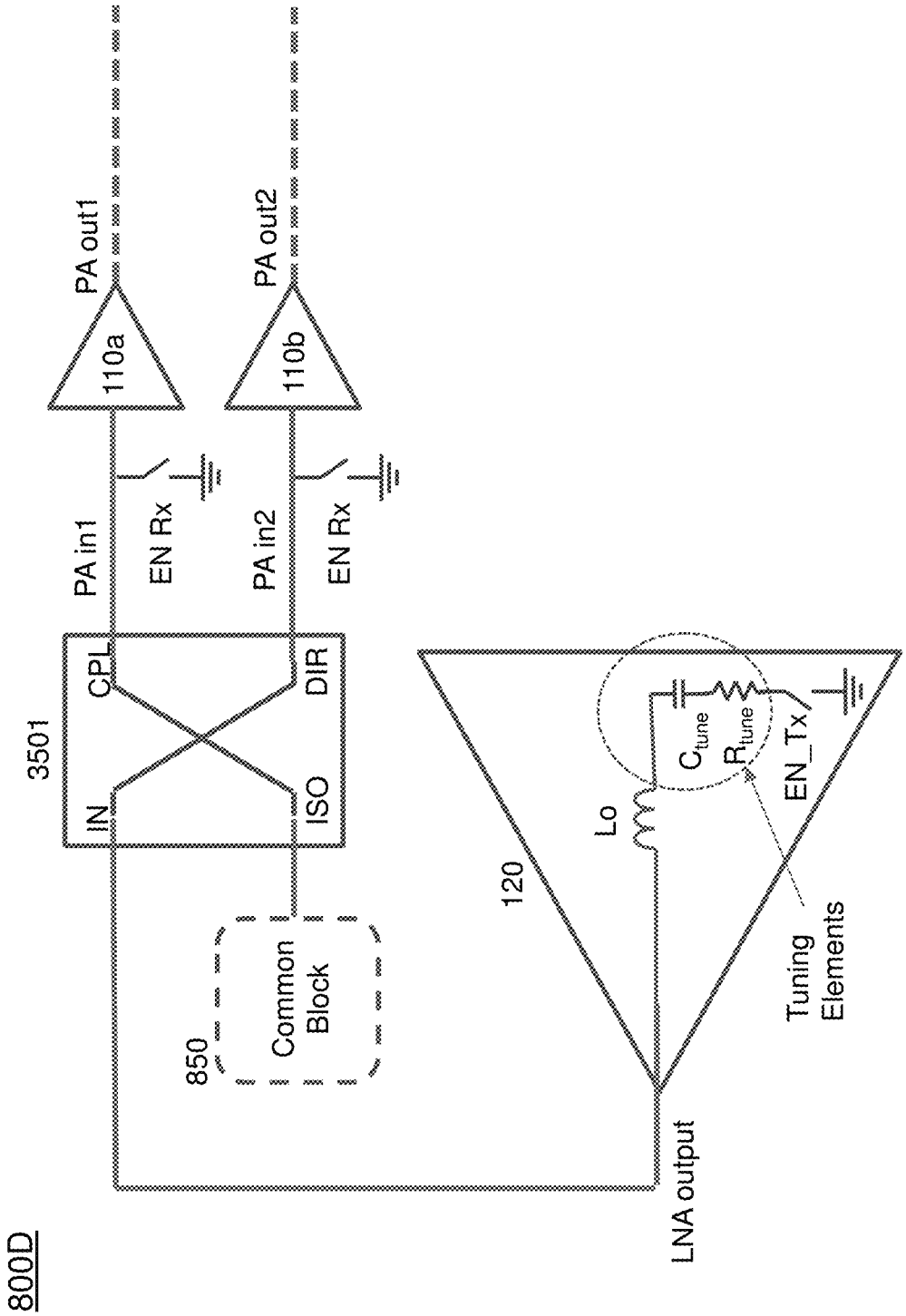
FIG. 8D shows an exemplary embodiment according to the present disclosure based on the TDM system of FIG. 5A, wherein tuning elements are used in the receive path to adjust an impedance seen by the input stage hybrid coupler looking into the receive path.

With continued reference to FIG. 8B and based on the above description of the various embodiments of the present disclosure, a person skilled in the art would clearly understand the principle of operation of the switching function of the RF signals based on the input hybrid coupler (3501) shown in FIG. 8B. A person skilled in the art would also understand that although the configuration of FIG. 8B shows switching functions performed by both the input hybrid coupler (3501) and the output hybrid coupler (3502), anyone configuration using either one of such couplers as a switch is possible as dictated by design goals and requirements. Additionally, a person skilled in the art would understand that although the configuration shown in FIG. 8B is based on the configuration of FIG. 7A where improvement in isolation between the transmit and receive paths may be provided via the (optional) switchable conduction paths (720, 720a), other configurations according to the present disclosure may be used to implement a switching function based on a corresponding input hybrid coupler (3501). Accordingly, any of the configuration according to the present teachings may be used independently by way of the input and/or the output hybrid couplers (3501, 3502). For example, FIG. 8C shows a configuration according to the present disclosure similar to the configuration shown in FIG. 8B but without the switchable conduction paths (720, 720a), and FIG. 8D shows another configuration according to the present disclosure where tuning elements are used to control an impedance termination at a port of the input hybrid coupler (3501) in a manner similar to one described above in reference to FIG. 6A. In the case of the configuration depicted in FIG. 8D, since the LNA amplifier (120) is connected to the hybrid coupler (3501) by way of an output impedance, Lo, of the LNA amplifier (120), tuning of the impedance termination is performed in view of the output impedance, Lo, of the LNA amplifier (120) as shown in FIG. 8D. It should be noted that the output impedance, Lo, may be the output impedance of the LNA amplifier (120) in its deactivated state (i.e., during a transmission phase of the system).

Figure 9:
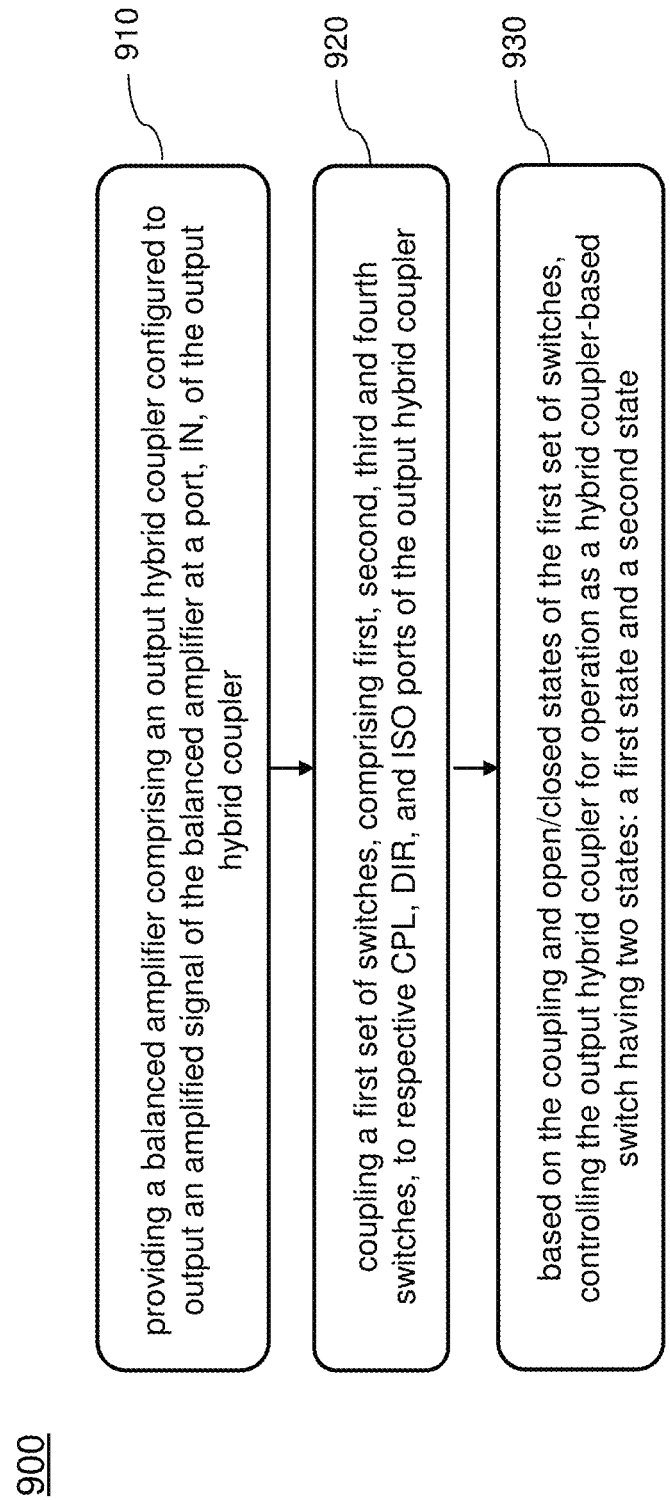
FIG. 9 is a process chart showing various steps of a method for transmitting and receiving signals in a time-division multiplexed system according to an embodiment of the present disclosure.

FIG. 9 is a process chart (900) showing various steps of a method for transmitting and receiving signals in a time-division multiplexed system. As can be seen in FIG. 9, such steps comprise: providing a balanced amplifier comprising an output hybrid coupler configured to output an amplified signal of the balanced amplifier at a port, IN, of the output hybrid coupler, per step (910); coupling a first set of switches, comprising first, second, third and fourth switches, to respective CPL, DIR, and ISO ports of the output hybrid coupler, per step (920); and based on the coupling and open/closed states of the first set of switches, controlling the output hybrid coupler for operation as a hybrid coupler-based switch having two states: a first state and a second state, per step (930), wherein in the first state, the hybrid coupler-based switch combines at the IN port, amplified quadrature signals of the balanced amplifier respectively coupled to the CPL and DIR ports, thereby delivering RF power directly to an antenna connected to the IN port, and wherein in the second state, the hybrid coupler-based switch combines at the ISO port, reflected signals from the CPL and DIR ports, the reflected signals being based on a division of a signal at the IN port that is received from the antenna, thereby delivering RF power from the antenna to a receive path coupled to the ISO port. According to a further embodiment of the present disclosure, during the second state of the step (930) of the process chart (900) of FIG. 9, the hybrid coupler-based switch can further divide a signal at the port ISO, reflect divided signals from the ports CPL and DIR, and combine reflected signals at the port IN of the output hybrid coupler.

It should be noted that the various embodiments of the hybrid coupler-based T/R switch according to the present disclosure, may be implemented as a monolithically integrated circuit (IC) according to any fabrication technology and process known to a person skilled in the art. For example, the hybrid coupler-based T/R switch may be used in a millimeter wave (e.g., 5G) RF front end circuit, such as, for example, in a phased array element controller of the front end circuit. In turn, the IC may be included in a module, and the module in a communications device, for example in any of the communication devices described below.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", U.S. Pat. No. 7,123,898, issued on Oct. 17, 2006, entitled "Switch Circuit and Method of Switching Radio Frequency Signals", U.S. Pat. No. 7,890,891, issued on Feb. 15, 2011, entitled "Method and Apparatus Improving Gate Oxide Reliability by Controlling Accumulated Charge", and U.S. Pat. No. 8,742,502, issued on Jun. 3, 2014, entitled "Method and Apparatus for use in Improving Linearity of MOSFETs Using an Accumulated Charge Sink—Harmonic Wrinkle Reduction", the disclosures of which are incorporated herein by reference in their entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuit arrangement comprising:
    i) a balanced amplifier comprising
        an output hybrid coupler comprising a first port, coupled port (CPL), a second port, direct port (DIR), a third port, isolated port (ISO), and a fourth port, input port (IN), the fourth port, IN, being configured for connection to an antenna;
    ii) first and second switches of a first set of switches, respectively coupled to the first port, CPL, and the second port, DIR;
    iii) a third switch of the first set of switches coupled to the third port, ISO, the third switch configured to selectively couple a terminating resistor to the third port, ISO; and
    iv) a fourth switch of the first set of switches coupled to the third port, ISO, the fourth switch configured to selectively couple a bypass conduction path to the third port, ISO,
    wherein during a first mode of operation of the circuit arrangement:
        the first and second switches are configured to respectively couple amplified phase-shifted signals of the balanced amplifier to the first port, CPL, and the second port, DIR,
        the third switch is closed so as to couple the terminating resistor to the third port, ISO, and
        the fourth switch is open so as to decouple the bypass conduction path from the third port, ISO.

2. The circuit arrangement according to claim 1, wherein during a second mode of operation of the circuit arrangement:
    the first and second switches are configured to:
        respectively decouple the amplified phase-shifted signals from the first port, CPL, and the second port, DIR, and
        respectively couple substantially identical impedances to the first port, CPL, and the second port, DIR,
    the third switch and the fourth switch are open.

3. The circuit arrangement according to claim 2, wherein during a third mode of operation of the circuit arrangement:
    the first and second switches are configured to:
        respectively decouple the amplified phase-shifted signals from the first port, CPL, and the second port, DIR, and
        respectively couple substantially identical impedances to the first port, CPL, and the second port, DIR,
    the third switch is open, and
    the fourth switch is closed to couple the bypass conduction path to the third port, ISO.

4. The circuit arrangement according to claim 3, wherein the substantially identical impedances are provided via one of: a) a short circuit to a reference ground, or b) an open circuit.

5. The circuit arrangement according to claim 4, wherein the first and second switches are shunting switches configured to provide the short circuit to the reference ground in their respective closed states.

6. The circuit arrangement according to claim 4, wherein the first and second switches are series switches configured to provide the open circuit in their respective open states.

7. The circuit arrangement according to claim 1, wherein the terminating resistor is connected to the third port, ISO.

8. The circuit arrangement according to claim 4, further comprising a low noise amplifier, LNA, coupled to the third port, ISO.

9. The circuit arrangement according to claim 8, wherein the low noise amplifier comprises an input transistor having a gate node that is coupled to the third port, ISO, and a source node that is coupled to a degeneration inductor.

10. The circuit arrangement according to claim 9, wherein the third switch and the fourth switch are coupled to the third port, ISO, through elements of an input match of the low noise amplifier that are coupled to the gate node of the input transistor.

11. The circuit arrangement according to claim 10, wherein the elements of the input match comprise an inductor in series connection with a capacitor.

12. The circuit arrangement according to claim 10, wherein the third switch is further configured to selectively couple to the third port, ISO, one or more reactive elements that are series-connected to the terminating resistor.

13. The circuit arrangement according to claim 12, wherein the one or more reactive elements are series-connected to the degeneration inductor.

14. The circuit arrangement according to claim 12, wherein the one or more reactive elements and the third switch are coupled between the gate node and the source node of the input transistor.

15. The circuit arrangement according to claim 10, wherein during the second mode of operation, a combined impedance seen by the third port, ISO, looking into the low noise amplifier, is substantially equal to an impedance seen at the fourth port, IN.

16. The circuit arrangement according to claim 10, wherein:
the first mode of operation is a transmit mode of operation for output at the fourth port, IN, a transmit RF signal based on combined amplified phase-shifted signals of the balanced amplifier that are coupled to the first port, CPL, and the second port, DIR,
the second mode of operation is a receive mode of operation for input at the fourth port, IN, a receive RF signal that is coupled to the third port, ISO, for amplification by the low noise amplifier, and
the third mode of operation is a bypass mode of operation for output or input at the fourth port, IN, of an RF signal that is coupled to the third port, ISO, and conducted through the bypass conduction path, thereby bypassing the balanced amplifier and the low noise amplifier.

17. The circuit arrangement according to claim 16, further comprising a single-pole multi-throw RF selection switch,
wherein a first throw of the RF selection switch is coupled to an input of the balanced amplifier,
wherein a second throw of the RF selection switch is coupled to an output of the low noise amplifier, and
wherein a third throw of the RF selection switch is coupled to the bypass conduction path.

18. The circuit arrangement according to claim 7, further comprising a switchable conduction path coupled to the third port, ISO, the switchable conduction path comprising:
a quarter wavelength transmission line based on a frequency of the signal at fourth port, IN; and
an additional shunting switch coupled at an end of the quarter wavelength transmission line away from the third port, ISO,
wherein during the first mode of operation, the additional shunting switch is closed so to provide an open seen by the third port, ISO, looking into the switchable conduction path, and
wherein during the second mode of operation, the additional shunting switch is open.

19. The circuit arrangement according to claim 18, further comprising a low noise amplifier, LNA, coupled to the additional shunting switch.

20. The circuit arrangement according to claim 1, further comprising an antenna connected to the fourth port, IN.

21. The circuit arrangement according to claim 1, further comprising a second set of switches comprising first, second and third switches, wherein:
the first and second switches of the second set are respectively coupled to a first port, CPL, and as second port, DIR, of an input hybrid coupler of the balanced amplifier,
the third switch of the second set is coupled to a fourth port, IN, of the input hybrid coupler by way of a second terminating resistor.

22. The circuit arrangement according to claim 1, wherein the circuit arrangement is monolithically integrated.

23. The circuit arrangement according to claim 22, wherein the circuit arrangement is monolithically integrated by using a fabrication technology comprising one of: a) silicon-on-insulator (SOI) technology, or b) silicon-on-sapphire technology (SOS).

24. The circuit arrangement according to claim 1, wherein each switch of the first set of switches is a field-effect transistor, FET, based switch comprising one or more stacked FETs.

25. The circuital arrangement according to claim 24, wherein the one or more stacked FETs are metal-oxide-semiconductor (MOS) FETs, or complementary metal-oxide-semiconductor (CMOS) FETs.

26. The circuital arrangement according to claim 1, wherein the circuital arrangement is adapted to transmit and receive a signal via an antenna connected at the fourth port, IN, that has a frequency equal to, or greater than, 1 GHz.

27. The circuital arrangement according to claim 1, wherein the circuital arrangement is adapted to transmit and receive a signal via an antenna connected at the fourth port, IN, that has a frequency equal to, or greater than, 10 GHz.

28. An electronic module comprising the circuit arrangement according to claim 1.

29. A phased array element comprising the circuit arrangement according to claim 1.

30. A method, comprising using of the electronic module of claim 28 in one or more electronic systems comprising: a) a television, b) a cellular telephone, c) a personal computer, d) a workstation, e) a radio, f) a video player, g) an audio player, h) a vehicle, i) a medical device, or j) other electronic systems.

* * * * *